(12) United States Patent
Watkins et al.

(10) Patent No.: US 12,174,533 B2
(45) Date of Patent: Dec. 24, 2024

(54) THERMAL IMPRINTING OF NANOSTRUCTURE MATERIALS

(71) Applicant: University of Massachusetts, Boston, MA (US)

(72) Inventors: James J. Watkins, South Hadley, MA (US); Feyza Dundar Arisoy, Redmond, WA (US); Irene R. Howell, The Hauge (NL); Vincent Einck, Vernon, VT (US)

(73) Assignee: University of Massachusetts, Boston, MA (US)

( * ) Notice: Subject to any disclaimer, the term of this patent is extended or adjusted under 35 U.S.C. 154(b) by 63 days.

(21) Appl. No.: 17/597,746

(22) PCT Filed: Jul. 22, 2020

(86) PCT No.: PCT/US2020/043075
§ 371 (c)(1),
(2) Date: Jan. 21, 2022

(87) PCT Pub. No.: WO2021/016354
PCT Pub. Date: Jan. 28, 2021

(65) Prior Publication Data
US 2022/0260904 A1   Aug. 18, 2022

Related U.S. Application Data

(60) Provisional application No. 62/877,814, filed on Jul. 23, 2019.

(51) Int. Cl.
*G06F 7/00* (2006.01)
*G03F 7/00* (2006.01)
(Continued)

(52) U.S. Cl.
CPC ........ *G03F 7/0002* (2013.01); *H01M 4/0402* (2013.01); *H01M 6/40* (2013.01)

(58) Field of Classification Search
None
See application file for complete search history.

(56) References Cited

U.S. PATENT DOCUMENTS 7,670,529 B2    3/2010   Choi et al.
2010/0221505 A1  9/2010   Amro et al.
(Continued)

FOREIGN PATENT DOCUMENTS

WO    2018009363       1/2018
WO    WO-2018170474 A1  9/2018
(Continued)

OTHER PUBLICATIONS

Chemweno, M., "Deactivation of Titanium Dioxide Photocatalyst by Oxidation of Polydimethylsiloxane and Silicon Sealant Off-Gas in a Recirculating Batch Reactor", Journal of the Air and Waste Management Association, 58:1, 12-18, DOI: 10.3155 1047-3289.58. 1.12, (Jan. 2008), 8 pgs.
(Continued)

*Primary Examiner* — Robert J Grun
(74) *Attorney, Agent, or Firm* — Schwegman Lundberg & Woessner, P.A.

(57) ABSTRACT

Various examples disclosed relate to a method of manufacturing a mechanically stabilized material that includes a nanostructure. The method includes providing a curable material disposed on a substrate. The curable material includes inorganic nanoparticles. The method further includes exposing the curable material and the substrate to pulsed electromagnetic radiation to form the mechanically stabilized material.

20 Claims, 10 Drawing Sheets

(51) Int. Cl.
*H01M 4/04* (2006.01)
*H01M 6/40* (2006.01)

(56) References Cited

U.S. PATENT DOCUMENTS

| | | |
|---|---|---|
| 2011/0014499 A1 | 1/2011 | Uchida et al. |
| 2011/0070462 A1 | 3/2011 | Uchida et al. |
| 2014/0072720 A1 | 3/2014 | Watkins et al. |
| 2015/0181714 A1 | 6/2015 | Ahmed et al. |

FOREIGN PATENT DOCUMENTS

| | | |
|---|---|---|
| WO | WO-2019067912 A1 | 4/2019 |
| WO | WO-2021016354 A1 | 1/2021 |

OTHER PUBLICATIONS

Harkness, B., "Demonstration of a Directly Photopatternable Spin-On-Glass Based on Hydrogen Silsesquioxane and Photobase Generators", Macromolecules 1998, 31, 4798-4805, (Jul. 1998), 8 pgs.

Krumpfer, J., "Rediscovering Silicones: Unreactive Silicones React with Inorganic Surfaces", Langmuir 2011, 27, 11514-11519., (Aug. 2, 2011), 6 pgs.

Mirley, C.L., "A Room Temperature Method for the Preparation of Ultrathin SiO* Films from Langmuir-Blodgett Layers", Langmuir, vol. 11, No. 4, 1995, (Jan. 1995), 4 pgs.

Nakabayashi, A., "Photoinduced Transformation of Silicone-modified TiO2", Chemistry Letters vol. 34, No. 2 (2005), (Jan. 2005), 2 pgs.

Pan, Q., "Spin-on-glass thin films prepared from a novel polysilsesquioxane by thermal and ultraviolet-irradiation methods", Thin Solid Films 345 (1999) 244-254, (Nov. 1998), 11 pgs.

Ro, H., "Silsesquioxanes in nanoscale patterning applications", Materials Today, Jan-Feb. 2011, vol. 14, No. 1-2., (2011), 14 pgs.

Sun, R., "Decomposition of gas phase octamethyltrisiloxane on TiO2 thin film photocatalysts catalytic activity, deactivation, and regeneration.", Journal of Photochemistry and Photobiology A: Chemistry 154 (2003) 203-209., (Aug. 2002), 7 pgs.

Tada, H., "Photoinduced Oxidation of Methylsiloxane Monolayers Chemisorbed on TiO2", Langmuir 1996, 12, 966-971, (Oct. 1995), 6 pgs.

"International Application Serial No. PCT/US2020/043075, International Search Report mailed Oct. 22, 2020", 2 pgs.

"International Application Serial No. PCT/US2020/043075, Written Opinion mailed Oct. 22, 2020", 7 pgs.

"International Application Serial No. PCT US2020 043075, International Preliminary Report on Patentability mailed Feb. 3, 2022", 9 pgs.

"European Application Serial No. 20844397.8, Response Filed Sep. 13, 2022 to Communication Pursuant to Rules 161 and 162 EPC Filed Mar. 3, 2022", 8 pgs.

"European Application Serial No. 20844397.8, Office Action mailed Oct. 20, 2023", 5 pgs.

"European Application Serial No. 20844397.8, Response filed Dec. 20, 2023 to Office Action mailed Oct. 20, 2023", 24 pgs.

"European Application Serial No. 20844397.8, Extended European Search Report mailed Jul. 3, 2024", 10 pgs.

THERMAL IMPRINTING OF NANOSTRUCTURE MATERIALS

PRIORITY APPLICATIONS

This application is a U.S. National Stage filing under 35 U.S.C. § 371 of PCT Patent Application No. PCT/US2020/043075, filed on Jul. 22, 2020, which claims priority to U.S. Provisional Application Ser. No. 62/877,814, filed Jul. 23, 2019, the disclosures of which are incorporated herein in their entirety by reference.

BACKGROUND

Structures can be formed using thermal imprinting. If the structures include one or more nanostructures however, defects can be imparted on the nanostructures during manufacturing procedures. These defects can render the structures to be insufficient for many high-end applications. There is therefore a need to develop procedures for reliably producing structures including one or more nanostructures.

SUMMARY OF THE DISCLOSURE

Various examples disclosed relate to a method of manufacturing a mechanically stabilized material that includes a nanostructure. The method includes providing a curable material disposed on a substrate. The curable material includes inorganic nanoparticles. The method further includes exposing the curable material and the substrate to pulsed electromagnetic radiation to form the mechanically stabilized material.

Various examples disclosed further relate to a method of manufacturing a mechanically stabilized material comprising a nanostructure. The method includes providing a curable material on a substrate. The curable material includes $TiO_2$ nanoparticles. The method includes exposing the curable material and the substrate to pulsed electromagnetic radiation with a wavelength of about 340 nm to about 380 nm and an energy dose of about 20 $J/cm^2$ to about 320 $J/cm^2$ to form the mechanically stabilized material, although other wavelength ranges and energy doses can be selected depending on the specific requirements of an application.

Various examples disclosed relate to a method of manufacturing a mechanically stabilized material comprising a nanostructure. The method includes providing an inorganic nanoparticle ink on a substrate. The method further includes stamping the inorganic nanoparticle ink on the substrate with a mold to form a curable material on the substrate. The curable material includes a shape on the substrate chosen from serpentine lines, parallel zig-zag lines, parallel lines, grid structures, slanted grid structures, blaze gratings, concentric circles, regular polygons, cylinders, posts, lens structures, flat lens structures, optical metasurfaces or combinations thereof. Other patterns include a Moiré alignment pattern. The method further includes exposing the mold, the curable material, and the substrate to pulsed electromagnetic radiation with a wavelength of about 340 nm to about 380 nm and an energy dose of about 20 $J/cm^2$ to about 320 $J/cm^2$ to form the mechanically stabilized material.

There are applications that require delivery of the electromagnetic radiation in such a way that avoids significant heating of the substrate, the stamp, the material being imprinted or the surrounding tooling. Examples include the use of substrates or imprinting materials in which significant heating is detrimental to the materials. Thermally sensitive materials can include biologically derived materials. Additional examples include imprinting process that require precise alignment of the stamp and printed materials to the substrate or printed features on the substrate, In particular, alignment with precision of tens of nanometers or less during an imprinting process requires the elimination of heating or thermal drift of the substrate or mold/stamp during the process. Temperature variations of less than a few degrees or in some cases a few tenths of a degree are required to achieve precision alignment. Here, the mold and the substrate are not substantially heated by the pulsed electromagnetic radiation. The method further includes removing the mold without substantially damaging the mechanically stabilized material.

There are applications that require extensive curing of the material such that the structures are mechanically stabilized prior to removal of the stamp. Examples include high aspect ratio structures, slanted structures, complex patterns and lens structures. Such curing methods must be conducted below a bulk temperature that leads to stamp degradation. Sufficient temperatures that enable sufficient curing in acceptable process times might not be achievable by bulk heating.

Various examples disclosed relate a mechanically stabilized material comprising a nanostructure. The material is formed according to a method. The method includes providing a curable material disposed on a substrate. The curable material includes inorganic nanoparticles. The method further includes exposing the curable material and the substrate to pulsed electromagnetic radiation to form the mechanically stabilized material.

BRIEF DESCRIPTION OF THE FIGURES

The drawings illustrate generally, by way of example, but not by way of limitation, various examples discussed in the present document.

DETAILED DESCRIPTION

Figure 1:
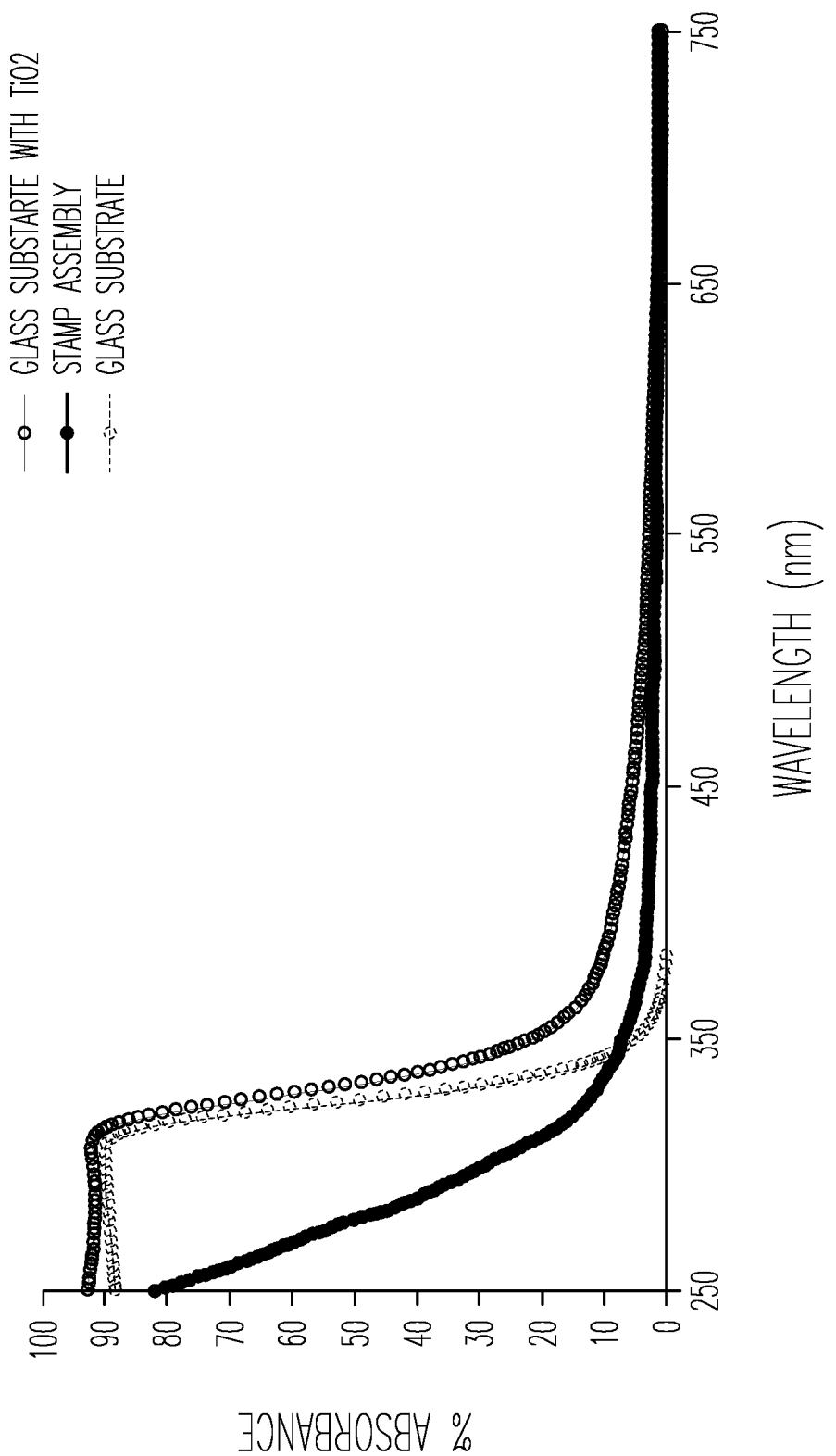
FIG. 1 shows the percent absorbance of a glass substrate and a titania film on glass and stamp assembly calculated from 100% transmission and a reflection at 45°.

Reference will now be made in detail to certain examples of the disclosed subject matter. While the disclosed subject matter will be described in conjunction with the enumerated claims, it will be understood that the exemplified subject matter is not intended to limit the claims to the disclosed subject matter.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section In the methods described herein, the acts can be carried out in any order without departing from the principles of the disclosure, except when a temporal or operational sequence is explicitly recited. Furthermore, specified acts can be carried out concurrently unless explicit claim language recites that they be carried out separately. For example, a claimed act of doing X and a claimed act of doing Y can be conducted simultaneously within a single operation, and the resulting process will fall within the literal scope of the claimed process.

The term "about" as used herein can allow for a degree of variability in a value or range, for example, within 10%, within 5%, or within 1% of a stated value or of a stated limit of a range, and includes the exact stated value or range.

The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%.

According to various examples of the present disclosure a method(s) of manufacturing a mechanically stabilized material comprising a nanostructure is described. In some examples, the nanostructures can include posts. The individual posts can have an aspect ratio (length to width) in a range of from about 4 to about 15, about 6 to about 10, less than equal to, or greater than about, 4, 5, 6, 7, 8, 9, 10, 11, 12, 13, 14, or 15. A width of an individual post can be in a range of from about 50 nm to about 250 nm, about 100 nm to about 200 nm, less than, equal to, or greater than about 50 nm, 60, 70, 80, 90, 100, 110, 120, 130, 140, 150, 160, 170, 180, 190, 200, 210, 220, 230, 240, or about 250 nm. A length of an individual post can be in a range of from about 400 nm to about 600 nm, 450 nm to about 550 nm, less than, equal to, or greater than about 400 nm, 410, 420, 430, 440, 450, 460, 470, 480, 490, 500, 510, 520, 530, 540, 550, 560, 570, 580, 590, or about 600 nm. The methods described herein are capable of reliably producing the mechanically stabilized material such that defects are not imparted by heat transfer from any components used in the method of manufacture. As discussed further herein, this can be a result of the ability to locally heat a precursor composition of the mechanically stabilized material and substantially avoid heating the constituents in contact with the precursor composition of the mechanically stabilized material.

According to various examples, a method of making the mechanically stabilized material can include providing or receiving a curable material. The curable material can be curable upon exposure to electromagnetic radiation. The curable material can include a collection of inorganic nanoparticles. The inorganic nanoparticles can have a major dimension that is in a range of from about 0.1 nm to about 100 nm, about 1 nm to about 75 nm, about 10 nm to about 50 nm, less than, equal to, or greater than about 0.1 nm, 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, 20, 20.5, 21, 21.5, 22, 22.5, 23, 23.5, 24, 24.5, 25, 25.5, 26, 26.5, 27, 27.5, 28, 28.5, 29, 29.5, 30, 30.5, 31, 31.5, 32, 32.5, 33, 33.5, 34, 34.5, 35, 35.5, 36, 36.5, 37, 37.5, 38, 38.5, 39, 39.5, 40, 40.5, 41, 41.5, 42, 42.5, 43, 43.5, 44, 44.5, 45, 45.5, 46, 46.5, 47, 47.5, 48, 48.5, 49, 49.5, 50, 50.5, 51, 51.5, 52, 52.5, 53, 53.5, 54, 54.5, 55, 55.5, 56, 56.5, 57, 57.5, 58, 58.5, 59, 59.5, 60, 60.5, 61, 61.5, 62, 62.5, 63, 63.5, 64, 64.5, 65, 65.5, 66, 66.5, 67, 67.5, 68, 68.5, 69, 69.5, 70, 70.5, 71, 71.5, 72, 72.5, 73, 73.5, 74, 74.5, 75, 75.5, 76, 76.5, 77, 77.5, 78, 78.5, 79, 79.5, 80, 80.5, 81, 81.5, 82, 82.5, 83, 83.5, 84, 84.5, 85, 85.5, 86, 86.5, 87, 87.5, 88, 88.5, 89, 89.5, 90, 90.5, 91, 91.5, 92, 92.5, 93, 93.5, 94, 94.5, 95, 95.5, 96, 96.5, 97, 97.5, 98, 98.5, 99, 99.5, or about 100 nm. The major dimension of the inorganic nanoparticles can be substantially the same for about 50 wt % to about 100 wt % of the inorganic nanoparticles, about 60 wt % to about 90 wt %, about 70 wt % to about 80 wt %, less than, equal to, or greater than about 50 wt %, 51, 51.5, 52, 52.5, 53, 53.5, 54, 54.5, 55, 55.5, 56, 56.5, 57, 57.5, 58, 58.5, 59, 59.5, 60, 60.5, 61, 61.5, 62, 62.5, 63, 63.5, 64, 64.5, 65, 65.5, 66, 66.5, 67, 67.5, 68, 68.5, 69, 69.5, 70, 70.5, 71, 71.5, 72, 72.5, 73, 73.5, 74, 74.5, 75, 75.5, 76, 76.5, 77, 77.5, 78, 78.5, 79, 79.5, 80, 80.5, 81, 81.5, 82, 82.5, 83, 83.5, 84, 84.5, 85, 85.5, 86, 86.5, 87, 87.5, 88, 88.5, 89, 89.5, 90, 90.5, 91, 91.5, 92, 92.5, 93, 93.5, 94, 94.5, 95, 95.5, 96, 96.5, 97, 97.5, 98, 98.5, 99, 99.5, or about 100 wt %.

Individual inorganic nanoparticles can conform to any suitable morphology. For example, individual inorganic nanoparticles can have a substantially spherical morphology in which the major dimension is a diameter or individual inorganic nanoparticles can be elongated nanoparticles having an aspect ratio greater than about 1:1. If the inorganic nanoparticle is elongated the major dimension can be a length of the nanoparticle. It is possible, in some examples, for the length of an elongated nanoparticle to be outside of the nanoscale range (e.g., 0.1 nm to about 100 nm) while still having at least one dimension (e.g., a width or thickness) within the nanoscale range.

The inorganic nanoparticles can include any suitable material or mixture of materials. For example, the inorganic nanoparticles can include metal oxide nanoparticles. The metal oxide nanoparticles can include $TiO_2$, $ZrO_2$, $LiMn_2O_4$, $Li_4Ti_5O_{12}$, or combinations thereof. As described further herein, exposure to the electromagnetic radiation can function to effectively sinter the inorganic nanoparticles. In some examples, it may be possible to further strengthen the connection between the inorganic nanoparticles by modifying the surface of none or more inorganic nanoparticles to include a bridging or cross-linking compound. Examples of such bridging or cross-linking compounds can include a silicone, a silane, a silsequioxane, a polyoligolsilsesquioxane, a compound comprising a vinyl moiety, a methacrylate, a compound comprising a benzocyclobutane moiety, or combinations thereof. According to various examples, at least some of the bridging or cross-linking compounds can include a protecting group bonded thereto to prevent a reaction from occurring before one is desired.

According to various examples, the inorganic nanoparticles are distributed about the curable material. The inorganic nanoparticles can be distributed about the curable material in a substantially homogenous or heterogenous manner. To aid in distributing the inorganic nanoparticles, at least some of the inorganic nanoparticles can have a surfactant functionalized to their surface. The surfactant can be hydrophobic, hydrophilic, or amphiphilic. Examples of suitable surfactants can include perfluoro, hydroscopic, branched, hyperbranched, linear, coblock, triblock or random copolymer surfactants.

The inorganic nanoparticles of the curable material can be distributed in any suitable medium. Examples of suitable mediums can include an aqueous medium, an ink, a resin mixture, or a combination thereof. Where the curable material includes a resin mixture, the resin mixture can include any curable resins such as acrylate resins, epoxy resins, or a mixture thereof. The curable material can further include additives that can enhance the properties of the curable material. Examples of suitable additives can include rheology modifiers, binders, sol-gel precursors, or mixtures thereof. Examples of suitable binders can include a methacrylate such as 3-trimethoxysilyl propyl methacrylate.

A pH of the curable material can be substantially acidic or neutral. For example, a pH of the curable material can be in a range of from about 1 to about 7, about 4 to about 5, less than, equal to, or greater than about 1, 2, 3, 4, 5, 6, or about 7. As described further herein, the pH of the curable material can be helpful to initiate linking or curing of the curable material. For example, the pH of the curable material can be selected to be a value that will help to cleave a protecting group from any bridging or cross-linking compound functionalized to an inorganic nanoparticle. The pH of the curable material can also be used to control the rate of reaction between any compounds linked or otherwise functionalized to the inorganic nanoparticles. The pH can be constant or can be modulated in the curable material.

The inorganic nanoparticles can account for any suitable concentration of the curable material by wt %. For example, the inorganic nanoparticles can be in a range of from about 0.01 wt % to about 100 wt % of the curable material, about 20 wt % to about 80 wt %, about 40 wt % to about 50 wt %, less than, equal to, or greater than about 0.01 wt %, 0.05, 0.1, 0.5, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 67, 68, 69 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or about 100 wt %.

Curing the curable material includes exposing the curable material to a source of electromagnetic radiation. The source of electromagnetic radiation can be chosen from many different types of sources. For example, the source can be a light emitting diode lamp. The source can include one light emitting diode lamp or an array including a plurality of light emitting diode lamps. Individual light emitting diode lamps can emit light at any desired frequency. The light can be emitted over the entirety of the curable material, or it can be delivered over only a preselected area of the curable material. According to various examples, the light emitted can be in the ultraviolet range. For example, the electromagnetic radiation can have a wavelength in a range of from about 250 nm to about 400 nm, about 300 nm to about 350 nm, less than, equal to, or greater than about 250 nm, 260, 270, 280, 290, 300, 310, 320, 330, 340, 350, 360, 370, 380, 390, or about 400 nm.

The electromagnetic radiation can be provided as a constant beam or in a pulsed manner. The energy dose provided to the curable material by the electromagnetic radiation can be in a range of from about 20 $J/cm^2$ to about 500 $J/cm^2$, about 200 $J/cm^2$ to about 400 $J/cm^2$, about 300 $J/cm^2$ to about 350 $J/cm^2$, less than, equal to, or greater than about 20 $J/cm^2$, 30, 40, 50, 60, 70, 80, 90, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490, or about 500 $J/cm^2$. If the electromagnetic radiation is delivered as a constant beam, the radiation can be delivered for any suitable amount of time. If the electromagnetic radiation is delivered in a pulsed manner, the electromagnetic radiation can be delivered according to a pulse sequence. A pulse sequence can include turning the electromagnetic radiation on for a set amount of time followed by turning the electromagnetic radiation off for a set amount of time. According to various examples, during a pulse sequence, the electromagnetic radiation can be turned on for a time period in a range of from about 5 ms to about 60 ms, about 20 ms to about 40 ms, less than, equal to, or greater than about 5 ms, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59 or about 60 ms. The electromagnetic radiation can then be turned off for an amount of time in a range of from about 70 ms to 150 ms, about 100 ms to about 130 ms, less than, equal to, or greater than about 70 ms, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, or about 150 ms. The pulse sequence can be repeated any number of times. For example, the pulse sequence can be repeated about 50 times to about 500 times, about 100 times to about 400 times, about 200 times to about 300 times, less than, equal to, or greater than about 50 times, 55, 60, 65, 70, 75, 80, 85, 90, 95, 100, 105, 110, 115, 120, 125, 130, 135, 140, 145, 150, 155, 160, 165, 170, 175, 180, 185, 190, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 400, 405, 410, 415, 420, 425, 430, 435, 440, 445, 450, 455, 460, 465, 470, 475, 480, 485, 490, 495, or about 500 times.

Exposing the curable material to the electromagnetic radiation can be effective to join the inorganic nanoparticles to each other to cure the composition and form the mechanically stabilized material. The inorganic nanoparticles can be joined by sintering, through linking between the binders and cross-linking compounds, or both. To begin sintering the pulsed electromagnetic radiation may locally heat the curable material to a temperature in a range of from about 0° C. to about 650° C., about 100° C. to about 400° C., less than, equal to, or greater than about 0° C., 10, 20, 30, 40, 50, 60, 70, 80, 90, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460,470, 480, 490, 500, 510, 520, 530, 540, 550, 560, 570, 580, 590, 600, 610, 620, 630, 640, or about 650° C. In examples where at least one inorganic nanoparticle includes the silicone, the silane, the silsequioxane, the polyoligolsilsesquioxane, the compound comprising a vinyl moiety, the methacrylate, the compound comprising a benzocyclobutane moiety, or combinations thereof that include a protecting group bonded thereto, the electromagnetic radiation or the pH of the curable material can cleave the protecting groups, which can help to expose functional groups for bonding such that at least some of the inorganic nanoparticles are joined by the groups functionalized thereto.

An advantage, according to various examples, of the present disclosure is that the curable material is capable of being heated to a greater degree than other components that it is in contact with. This can be beneficial for allowing the curable material to be cured in such a manner that it can reliably replicate a predetermined nanostructure shape.

According to various examples, one component, which the curable material can be heated to a greater degree than, can include a substrate to which the curable material is applied can have a nanostructure shape to which the curable material is applied. When the curable material is cured, the nanostructure shape is imprinted therein. The nanostructure shape can include features or combinations of features chosen from serpentine lines, parallel zig-zag lines, parallel lines, grid structures, concentric circles, regular polygons, or combinations thereof. Individual features can have at least one dimension in the nanoscale. For example, a length, width, height, or thickness can be in a range of about 0.1 nm and about 100 nm, about 1 nm to about 75 nm, about 10 nm to about 50 nm, less than, equal to, or greater than about 0.1 nm, 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, 20, 20.5, 21, 21.5, 22, 22.5, 23, 23.5, 24, 24.5, 25, 25.5, 26, 26.5, 27, 27.5, 28, 28.5, 29, 29.5, 30, 30.5, 31, 31.5, 32, 32.5, 33, 33.5, 34, 34.5, 35, 35.5, 36, 36.5, 37, 37.5, 38, 38.5, 39, 39.5, 40, 40.5, 41, 41.5, 42, 42.5, 43, 43.5, 44, 44.5, 45, 45.5, 46, 46.5, 47, 47.5, 48, 48.5, 49, 49.5, 50, 50.5, 51, 51.5, 52, 52.5, 53, 53.5, 54, 54.5, 55, 55.5, 56, 56.5, 57, 57.5, 58, 58.5, 59, 59.5, 60, 60.5, 61, 61.5, 62, 62.5, 63, 63.5, 64, 64.5, 65, 65.5, 66, 66.5, 67, 67.5, 68, 68.5, 69, 69.5, 70, 70.5, 71, 71.5, 72, 72.5, 73, 73.5, 74, 74.5, 75, 75.5, 76, 76.5, 77, 77.5, 78, 78.5, 79, 79.5, 80, 80.5, 81, 81.5, 82, 82.5, 83, 83.5, 84, 84.5, 85, 85.5, 86, 86.5, 87, 87.5, 88, 88.5, 89, 89.5, 90, 90.5, 91, 91.5, 92, 92.5, 93, 93.5, 94, 94.5, 95, 95.5, 96, 96.5, 97, 97.5, 98, 98.5, 99, 99.5, or about 100 nm.

According to various examples, the substrate can be free of any of the afore mentioned nanostructures. In such an example, the curable material can be disposed on the substrate and a stamp or mold can be contacted with the curable material. The stamp or mold can include a nanostructure shape. The nanostructure shape can include features or combinations of features chosen from serpentine lines, parallel zig-zag lines, parallel lines, grid structures, concentric circles, regular polygons, or combinations thereof. Individual features can have at least one dimension in the nanoscale. For example, a length, width, height, or thickness that is in a range of about 0.1 nm and about 100 nm, about 1 nm to about 75 nm, about 10 nm to about 50 nm, less than, equal to, or greater than about 0.1 nm, 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, 20, 20.5, 21, 21.5, 22, 22.5, 23, 23.5, 24, 24.5, 25, 25.5, 26, 26.5, 27, 27.5, 28, 28.5, 29, 29.5, 30, 30.5, 31, 31.5, 32, 32.5, 33, 33.5, 34, 34.5, 35, 35.5, 36, 36.5, 37, 37.5, 38, 38.5, 39, 39.5, 40, 40.5, 41, 41.5, 42, 42.5, 43, 43.5, 44, 44.5, 45, 45.5, 46, 46.5, 47, 47.5, 48, 48.5, 49, 49.5, 50, 50.5, 51, 51.5, 52, 52.5, 53, 53.5, 54, 54.5, 55, 55.5, 56, 56.5, 57, 57.5, 58, 58.5, 59, 59.5, 60, 60.5, 61, 61.5, 62, 62.5, 63, 63.5, 64, 64.5, 65, 65.5, 66, 66.5, 67, 67.5, 68, 68.5, 69, 69.5, 70, 70.5, 71, 71.5, 72, 72.5, 73, 73.5, 74, 74.5, 75, 75.5, 76, 76.5, 77, 77.5, 78, 78.5, 79, 79.5, 80, 80.5, 81, 81.5, 82, 82.5, 83, 83.5, 84, 84.5, 85, 85.5, 86, 86.5, 87, 87.5, 88, 88.5, 89, 89.5, 90, 90.5, 91, 91.5, 92, 92.5, 93, 93.5, 94, 94.5, 95, 95.5, 96, 96.5, 97, 97.5, 98, 98.5, 99, 99.5, or about 100 nm.

By minimizing the degree to which the substrate, mold, or both are heated it is less likely that a defect will be imparted on to the mechanically stabilized material. For example, it is less likely that the substrate, mold, or both will deform upon exposure to heat and impart that defect in the curable material during the curing process. According to various examples, the substrate, mold, or both may increase in temperature by less than 10° C. during the exposing, less than 9° C., less than 8° C., less than 7° C., less than 6° C., less than 5° C., less than 4° C., less than 3° C., less than 2° C., less than 1° C., less than 0.5° C., less than 0.25° C., or even substantially free of heating during the exposing.

The low degree to which the substrate, mold, or both are heated during exposure can be a result of many factors. For example, the repeated pulsing sequences can limit the time to which the substrate, mold, or both are exposed to electromagnetic radiation and there may not be enough time for heat to significantly build in the substrate, mold, or both. This can be further enhanced by including materials in the substrate, mold, or both that have a high heat capacity. Alternatively or additionally, the substrate, mold, or both can be formed from a material that is substantially transparent to ultraviolet radiation. In these examples, where the electromagnetic radiation is ultraviolet radiation, the ultraviolet radiation can pass directly through the substrate, mold, or both and impart heat to the curable material without substantially heating the substrate, mold, or both.

The use of pulsed electromagnetic radiation to cure the composition while limiting the temperature rise of the substrate, mold, or master to less than 10° C. during the exposure, less than 9° C., less than 8° C., less than 7° C., less than 6° C., less than 5° C., less than 4° C., less than 3° C., less than 2° C., less than 1° C., less than 0.5° C., less than 0.25° C., or even substantially free of heating, in combination with a precision alignment technique can be used to align structures to the substrate or features on one or both sides of the substrate to nanoscale dimensions for example of less than 250 nm, less than 100 nm, less than 50 nm, less than 25 nm, less than 15 nm, less than 10 nm, less than 5 nm, or less than 3 nm. As a general matter, greater precision in alignment can require the lower temperature values described above as high temperatures can lead to more deformities.

In some examples the precise alignment of mechanically stable imprinted nanostructures can be achieved through simultaneous use of pulsed electromagnetic radiation described above to achieve the minimal temperature variation in combination with Moiré alignment techniques.

According to various examples, the temperature rise during pulsed electromagnetic radiation (e.g., ultraviolet radiation) can be further controlled by selecting mold materials and substrate materials that are each substantially transparent to the wavelength of the electromagnetic radiation as described above. In some further examples of the present disclosure, the source of the electromagnetic radiation will be chosen, tuned or filtered such that the wavelength of radiation impinging on the mold or substrate or both are substantially transparent to the mold and substrate. In some examples, the material being imprinted will be chosen to absorb the wavelength of the electromagnetic radiation selectively with respect to the mold and substrate. In some examples an additive that absorbs strongly in the wavelength range of the electromagnetic radiation will be added to the material being imprinted to enhance the relative selectivity of absorption of the electromagnetic radiation in the material system being imprinted relative to the mold, the substrate of the mold and substrate.

Some examples of the disclosure include the simultaneous selection of a range of electromagnetic radiation, a range of pulse sequences and pulse energies, a mold that is substantially transparent to the electromagnetic radiation, a substrate that is substantially transparent to the electromagnetic radiation and a material to be imprinted that absorbs the electromagnetic radiation selectively with respect to the mold and substrate such that the material can be cured with a temperature rise of less than less than 10° C. during the exposing, less than 9° C., less than 8° C., less than 7° C., less than 6° C., less than 5° C., less than 4° C., less than 3° C., less than 2° C., less than 1° C., less than 0.5° C., less than 0.25° C., or even substantially free of heating to achieve a mechanically stable structure that is aligned to the substrate or features on the substrate using a precision alignment technique such as Moiré alignment.

According to various examples, the mechanical strength of the structures formed can be further enhanced by allowing the binders or binder precursors to be modified upon exposure to the electromagnetic radiation. For example, in some examples the electromagnetic radiation can cause the removal of substantially all of the organic material from the imprinted material (e.g., from the binder or binder precursor or from the nanoparticle ligands). The removal of organic materials can be accomplished substantially simultaneously with the reaction of the binders in the system. In some examples the electromagnetic radiation cause oxidation of a binder material or precursor to a binder material provide a substantially inorganic material that helps to bind the structure together. In some examples the precursor to the binder material or the binder material contains Si. In some examples the precursor to the binder material or the binder material can include a siloxane, a silane, a silicon alkoxide, a silicon oxide, or a mixture thereof. In some examples the precursor to the binder material or the binder material can be converted into a silicon oxide species.

In some examples the binder or the precursor to the binder material can include Ti. In some examples the binder or the precursor to the binder material can include titanium in the form of a titanium alkoxide. In some examples the binder or the precursor to the binder material is converted to a titanium oxide species. In some examples the material being imprinted contains titania or precursors to titania or a precursor thereof, In some examples the material being imprinted is photocatalytic. In some examples the photocatalytic material being imprinted can interact with the electromagnetic radiation to catalyze reactions at a low temperature that promote binding of the structure being imprinted. These reactions can involve the generation of free radicals or involve oxidation. In some examples the photocatalytic material being imprinted interacts with the electromagnetic radiation to facilitate the removal of organic species from the material being imprinted. In some examples the material being imprinted includes a binder or precursor to a binder that is photocatalytically triggered. In some examples the material being imprinted includes a binder or precursor to a binder and produces a species that upon reaction is photocatalytically reactive.

In some examples the photocatalytic material being imprinted can interact with the electromagnetic radiation to catalyze the removal of organics from the imprinted structure. In some cases the removal of organic material improves the optical properties of the imprinted structure. If the organic materials are not removed they can cause yellowing of a printed lens. In some cases the removal of organic material improves the stability of optical properties of the imprinted structure. In some cases the removal of organic material improves the stability of optical properties of the imprinted structure such the yellowing of lenses, waveguides and other optical devices by degradation of residual organics during use or storage the device. The substrate, mold, or both can include any suitable material or mixture of materials. For example, the substrate, mold, or both can include a plastic, an ultraviolet transparent glass, a biological material or a mixture thereof. To ease in removing the mechanically stabilized material from the mold, substrate or both, a release agent can be coated on the mold, substrate or both. An example of a suitable release agent includes a PEG-b-PFPE block copolymer. According to various examples, the presence of a release agent can help to substantially prevent the mechanically stabilized material from being damaged when removed from contact with the substrate, mold, or both. This can help to prevent the nanostructure from being compromised. The curing process described herein can be executed any number of times such that the mechanically stabilized material can include a plural number of layers.

The methods described herein can be used to manufacture many suitable devices such as an electrode, battery, optical device, diffractive optical element a single- or double-sided optical blaze grating, a flat lens, or a meta-lens.

EXAMPLES

Various examples of the present disclosure can be better understood by reference to the following Examples which are offered by way of illustration. The present disclosure is not limited to the Examples given herein.

Nanoimprint lithography (NIL) has been used to pattern polymers, composites and small molecules. NIL can include a thermal or UV curing process by which a solution or melt can be solidified in order to facilitate release between a patterned stamp made of polydimethylsiloxane (PDMS). Resin choices can include photopolymers, prepolymers, or polymer solutions. Polymer solutions can be fabricated through solvent assisted NIL, where a polymer solution can be imprinted by removal of solvent through the PDMS stamp.

A limitation of the process for optics is refractive index due to the modest refractive index of most polymers. Optical grade titania nanoparticles with high refractive index can require inorganic nanoparticles with sufficiently low aggregation and size to minimize uncontrollable interaction with light. For these processes, smaller than 20 nm titania particles are used in order to achieve high optical clarity and minimal haze.

A binding agent can include a small molecule, oligomer, polymer or ligand that facilitates nanoparticle packing and pattern formation as well as structural integrity both during use as well as during release. Binding agents can require specific chemistries in order to interact with the desired nanoparticles and not bind or substantially minimize binding with the PDMS stamp during patterning. Chemistries can include sol gel and/or radical chemistries. In some examples the photocatalytic nature of $TiO_2$ can activate the chemistries in the presence of light. It was found that 3 trimethoxysilyl propyl methacrylate (3MPS) were particularly effective as it has a sol gel and a methacrylate reactive handle with a small flexible propyl spacer. The binder effectiveness is highly sensitive to binder length, since large polymeric binders can inhibit proper spin coating or cause inhomogeneity on the nanoscale in the solution. Small molecule sol gel binders can also make the structure brittle as they have less flexibility and a short range of connection, which become brittle upon densification due to residual stresses.

A release agent is helpful for the patterning of Titania nanoparticles with PDMS as titania is a photooxidation catalyst that has been shown to oxidize the surface of PDMS to silica under UV exposure, which greatly increases adhesion. This can result in broken structures and stamp contamination. By incorporating a small quantity of surfactant, the interface between the solution and stamp can be coated in order to reduce oxidation of PDMS as well as to lubricate for release. Choice release agents can include a hydrogen bonding moiety as well as a perfluoro component. Successful perfluoro components include PEG-b-PFPE block copolymers such as commercially available FS66. Other release agents with different polymeric structures are being tested for their effectiveness. It was suspected that the FS66 is partially absorbed into the PDMS stamp and forms a protective layer between the imprint material, where the PEG block is preferred, and the stamp, where the perfluoro block is preferred. Because perfluorocarbon chains can be very difficult to oxidize, they acted as an oxidation barrier as the diffusion distance of $TiO_2$ radicals is on the order of 0.5 nm. Solutions can only tolerate small quantities of linear block fluorocopolymers before macroscopic phase separation appears and disrupts consistent spin coating.

The UV cure was varied between pulsed or continuous modes depending on desired process time. A 365 nm LED UV source built by Carpe DiemTechnologies. In order to impart mechanical integrity to tilted, nanoimprinted nanoparticles, we used a through-stamp annealing method. Taking advantage of the UV absorption of $TiO_2$, during the imprinting step the substrate with the stamp was placed beneath an adjustable-dose LED 365 nm UV lamp in either a continuous or pulsed mode.

The transmittance of the glass substrate, titania film, and stamp assembly was measured to determine which component enables the binding activity. Additionally, reflectance measurements were taken to determine percent reflection of incoming light. The absorption was calculated from these measurements and plotted in FIG. 1. The 200 nm thick titania film increased the absorption of the substrate by >10× at 365 nm from 1.33% absorption of the 0.6 mm glass substrate to 13.82% of the film and glass substrate. The film was prepared in the same means as an imprint by spin coating at 4000 rpm for 4 seconds, and subsequent UV treatment with 5 ms on 15 ms off 365 nm light pulses for 3000 repetitions (60 seconds). The wavelength of the UV light was chosen such that the glass substrate and the stamp assembly are substantially transparent whereas the material to be imprinted, in this case the titania film absorbs strongly.

The imprint procedure began with ink formulation, where the nanoparticle base (Pixelligent 50 wt % titania in PGMEA) was diluted to ~6 wt % titania with an ethyl lactate (Sigma) stock containing 0.15% Capstone FS66 (Sigma). The binder was added dropwise in accordance with 15 wt % of total solids (85% titania). The solution was then subjected to vortex mixing to homogenize the dispersion and sonicated for 15 minutes. Meanwhile, mechanical grade silicon wafers were diced into 1" by 1" substrates, washed with IPA, air dried and treated with UV/Ozone for 15 minutes. The sonicated solution was then filtered with a 0.45 um PFPE syringe filter. Spin coating at 4000 rpm for 4 seconds provided a 30 second wait time before imprinting where the film evaporated and was imprinted between 30-40 seconds after spin coating (required for process times). The stamp was placed during the imprint window with gentle, consistence force across the wafer in a sweeping motion with a single finger. The assembly was then transferred to the pulsed UV tool and irradiated at 5 ms on 15 ms off, 3000 reps, 35V and 60 seconds. The temperature change was reported from the thermocouple below the sample holder of the tool. After UV treatment, the assembly was moved to a vacuum chuck and the stamp was released following a diagonal direction with the fin tip direction.

After applying 20.7 $J/cm^2$ in continuous mode over one minute, the substrate/stamp assembly increased from room temperature to well above 50° C. and was hot to the touch as measured above the sample tray. It was allowed to cool before removing the stamp, revealing the imprinted $TiO_2$ nanostructures. This method resulted in robust tilted nanostructures, however, the amount of heat generated was not suitable for certain applications, so pulsed mode was used to avoid excessive heat generation. In this case, the experiments were carried out at room temperature (e.g. 25° C.), however, the entire process could potentially be carried out at any temperature between room temperature and approximately 150° C. while maintaining near-isothermal conditions.

Figure 2B:
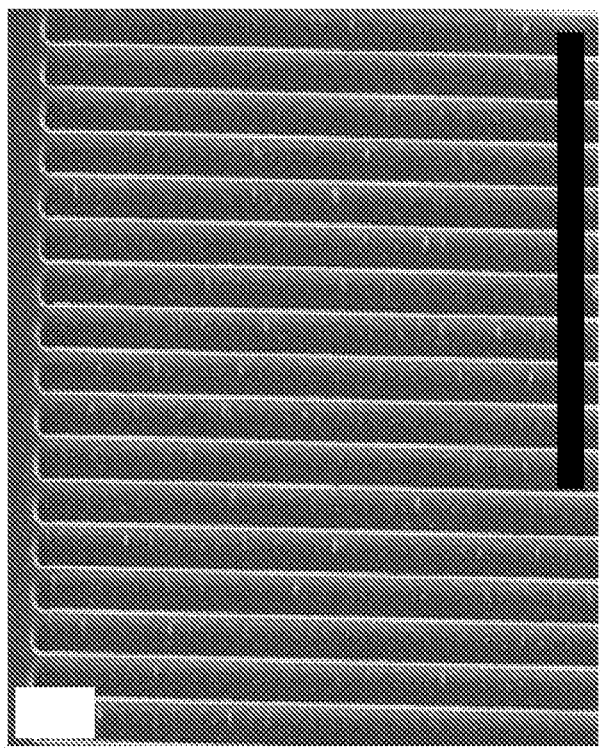
FIG. 2B shows an imprinted nanostructure after pulsed exposure to ultraviolet radiation.
Figure 2A:
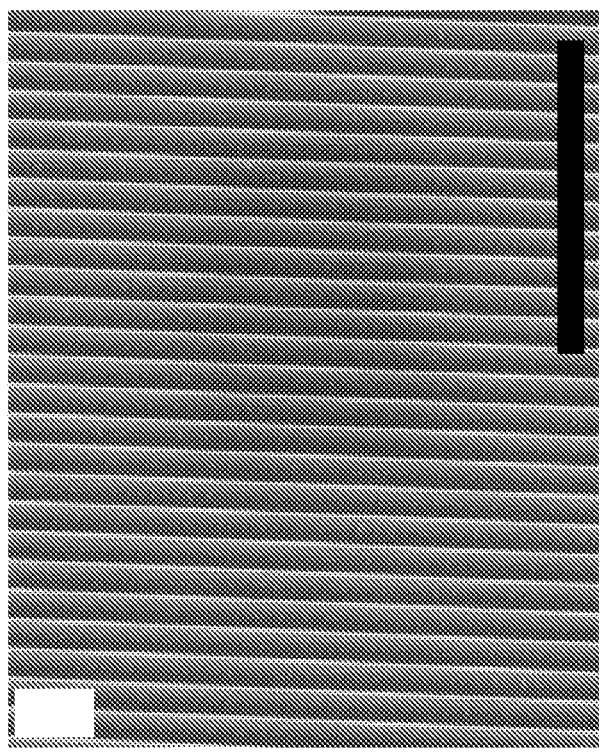
FIG. 2A shows an imprinted nanostructure after continuous exposure to ultraviolet radiation.

For the pulsed mode, the stamp/substrate assembly was similarly placed beneath the UV source and 12.8 $J/cm^2$ were delivered over 12 seconds in 30 ms pulses. The dose was delivered in 100 lamp pulses of 30 ms on, 90 ms off, allowing for heat dissipation. In this case, the temperature of the tray holding the assembly increased by less than 1° C. Similar robust structures were obtained after 12 s of the pulsed UV treatment, as shown in FIG. 2B. Patterns without any UV treatment were unable to be successfully replicated due to breakage during demolding.

Figure 3:
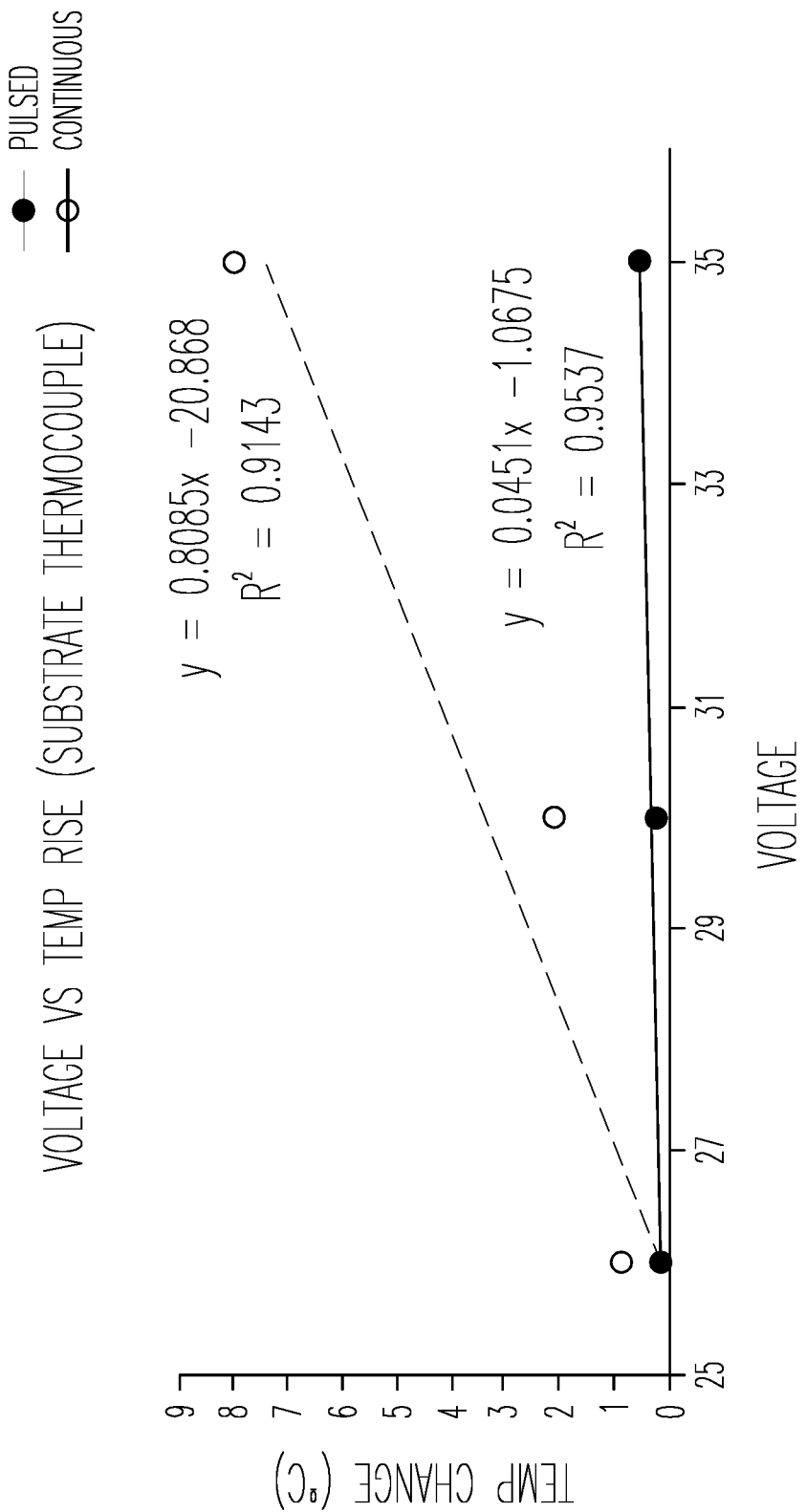
FIG. 3 shows the temperature change of a substrate for continuous and pulsed UV at 83.3 $mJ/cm^2$.

Heat generated by the process was quantitated utilizing a thermocouple taped to the backside of a sample. The temperature change at different driving voltages was conducted to determine the heat dissipation effectiveness of the pulsed system. 5 ms on and 15 ms off pulses were used and the dosage was kept at 83.3 $mJ/cm^2$ for both continuous and pulsed at 26, 30 and 35 volts. As seen in FIG. 3, the heat change from the continuous system is significantly higher (15×) compared to the continuous, indicating more localized heating.

Figure 4A:
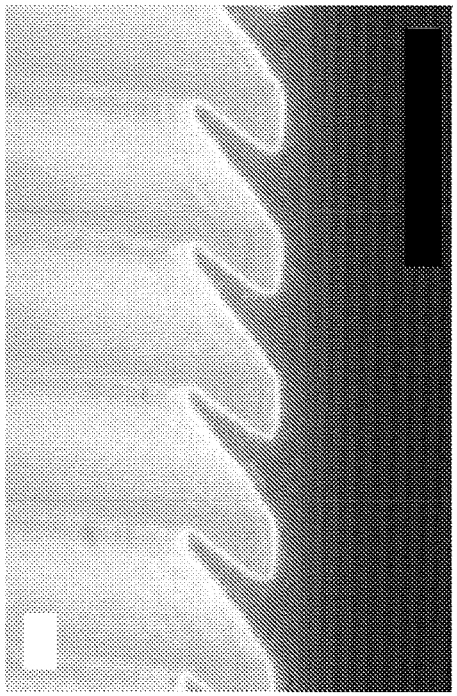
FIG. 4A shows a nanostructure fabricated using small molecule binders.
Figure 4B:
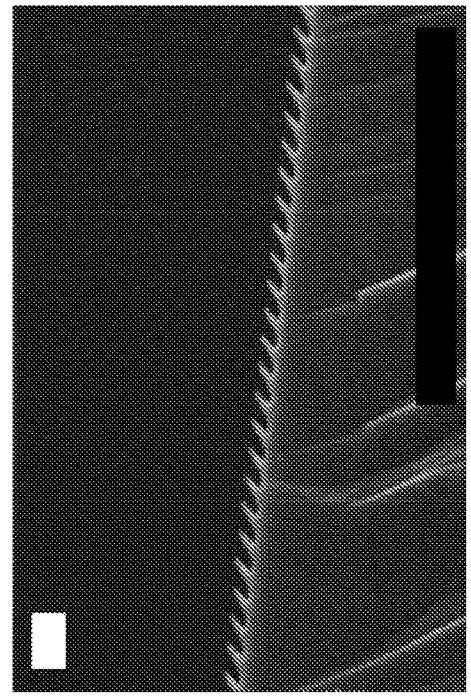
FIG. 4B shows a zoomed view of the nanostructure of FIG. 4A.
Figure 4C:
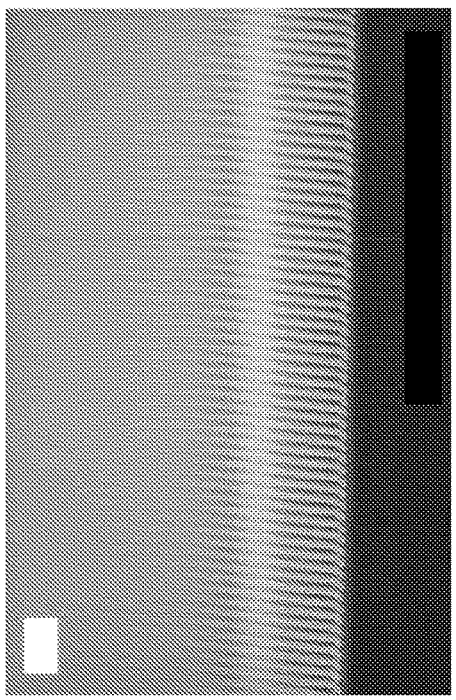
FIG. 4C shows a nanostructure fabricated using small molecule binders.
Figure 4D:
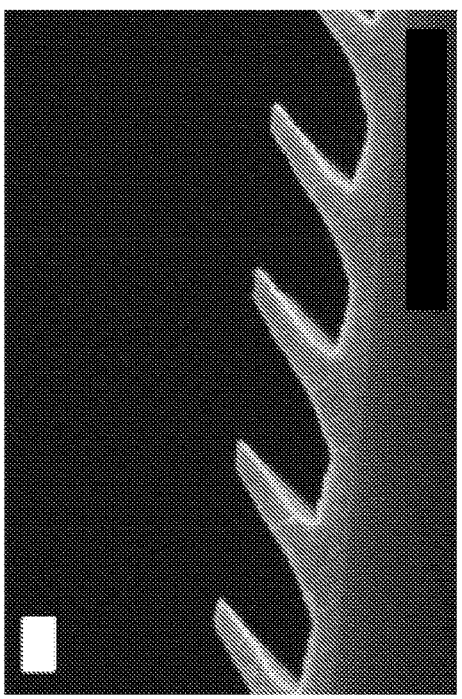
FIG. 4D shows a zoomed view of the nanostructure of FIG. 4C.

By utilizing 35V, 5 ms on 15 ms off, 3000 repetitions and 49.9 J/cm$^2$, tilted titania nanoparticle composites were fabricated with good reproducibility and a temperature change of the built-in tray thermocouple of less than 0.5° C. FIGS. 4A and 4B provide an example of a small molecule binder, 3MPS (Pixelligent TiO$_2$ 6.00%, PGMEA 6.00%, Ethyl Lactate 85.6%, 3MPS 2.3% and Capstone FS66 0.1% by weight), and FIGS. 4C and 4D demonstrate a UV curable PDMS oligomer matrix (Pixelligent TiO$_2$ 5.59%, PGMEA 5.59%, Ethyl Lactate 87.81%, Zipcone™ UA 0.88% and Capstone FS66 0.13%), which utilizes a photoradical generator and acrylate polymerization chemistry.

Figure 5B:
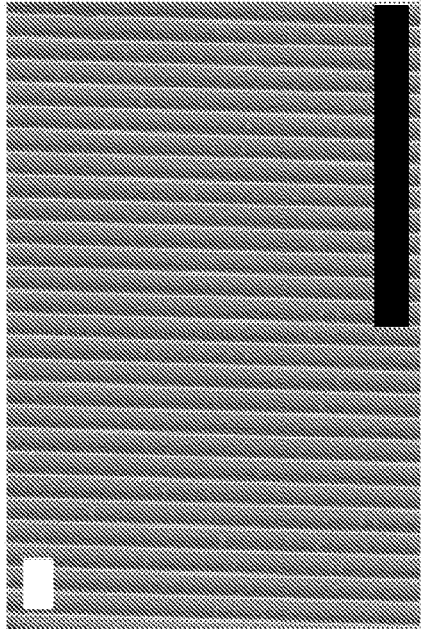
FIG. 5B shows a zoomed view of the nanostructure of FIG. 5A.
Figure 5D:
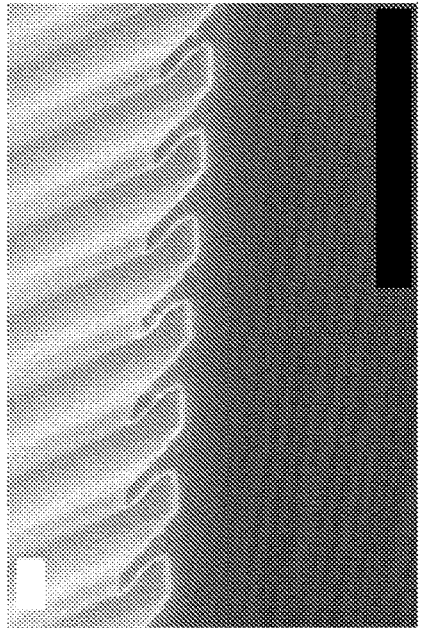
FIG. 5D shows a zoomed view of the nanostructure of FIG. 5C.
Figure 5A:
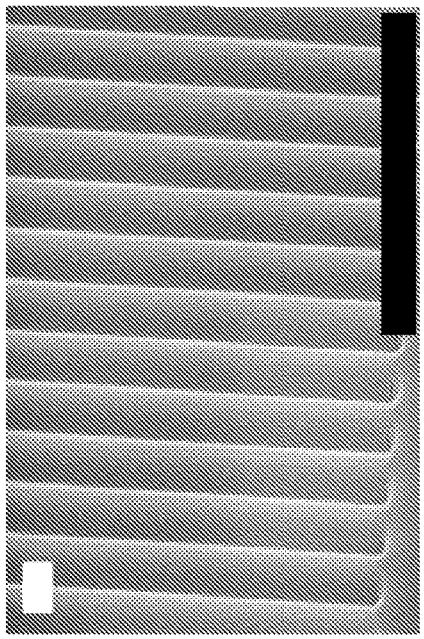
FIG. 5A shows a nanostructure fabricated using small molecule binders and joined using a photoacid generator.
Figure 5C:
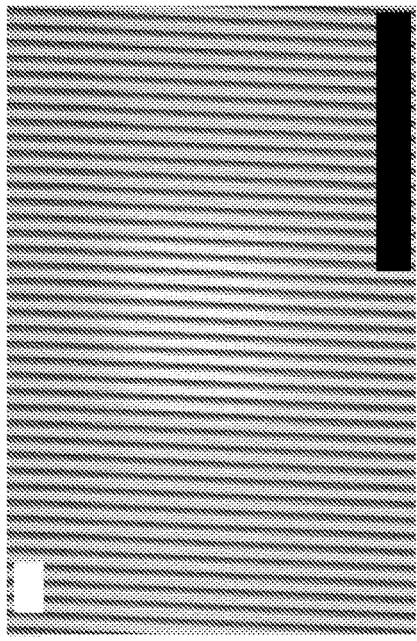
FIG. 5C shows a nanostructure fabricated using small molecule binders and joined using a photoacid generator.

Fabrication of these nanostructures can also be achieved by utilizing photoacid generators that degrade at 365 nm, which can react with an oligomeric or molecular matrix. FIGS. 5A and 5B were fabricated with zirconia nanoparticles from Pixelligent and used 3MPS as a binder and trisulfonium triflate as an acid generator to facilitate the sol gel reactivity of 3MPS. FIGS. 5C and 5D utilize a Zipcone™ UE binder, which is an oligomeric PDMS with epoxy side chains that polymerize from a UV active photoacid stimulus.

Figure 6A:
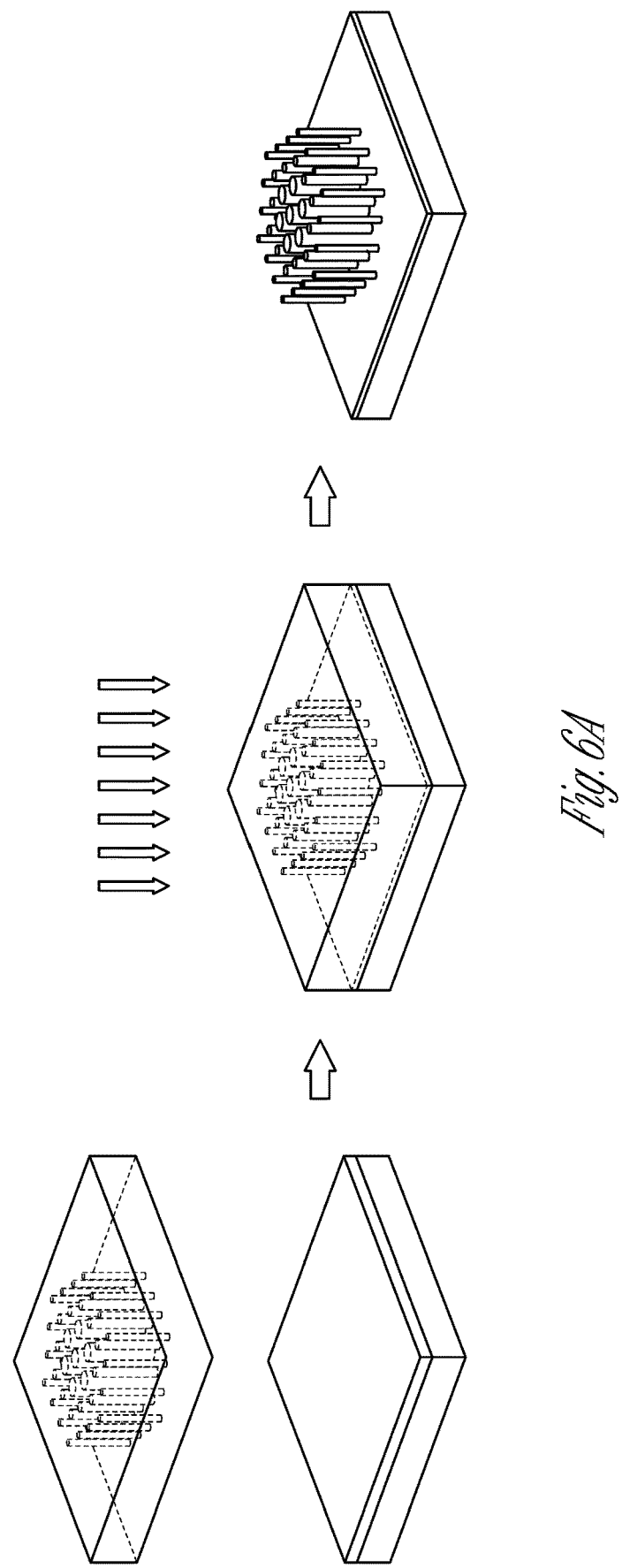
FIG. 6A schematically shows a method of making a fabricated structure.
Figure 6C:
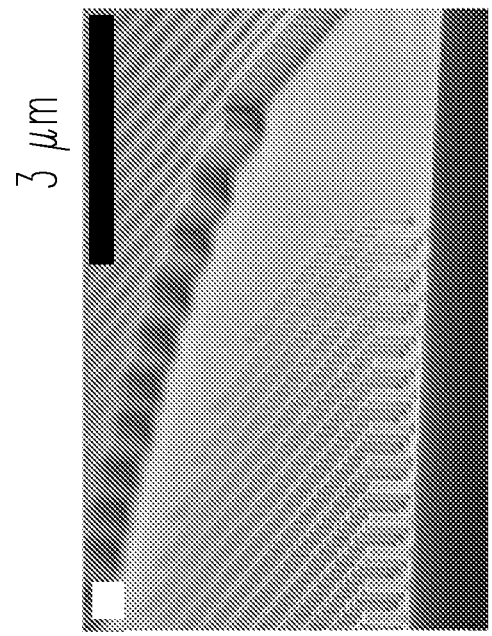
FIG. 6C shows the fabricated structure of FIG. 6B zoomed out relative to FIG. 6B.
Figure 6B:
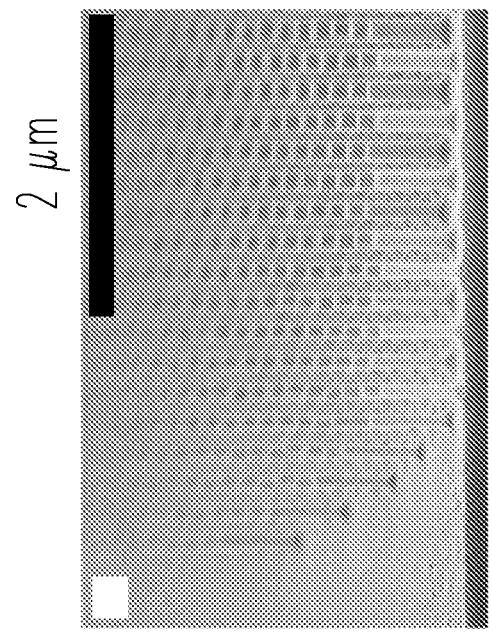
FIG. 6B shows a fabricated structure formed according to the method of FIG. 6A including nanoposts.
Figure 7A:
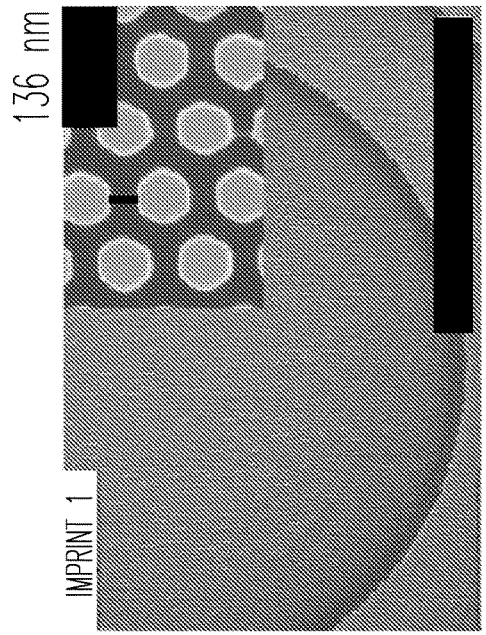
FIGS. 7A-7D shows a series of fabricated structure including nanoposts with a hexagonal cross-sectional profile.
Figure 7B:
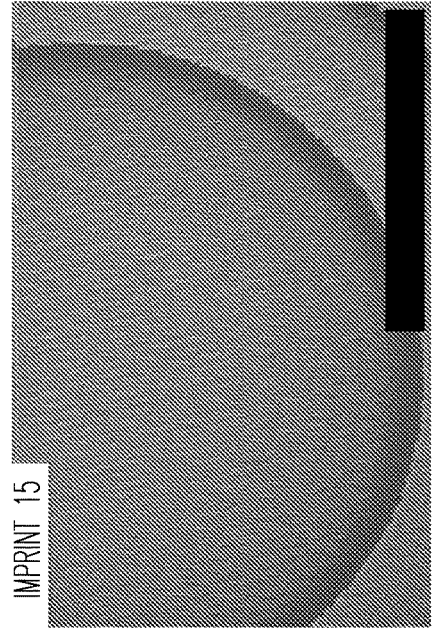
Figure 7C:
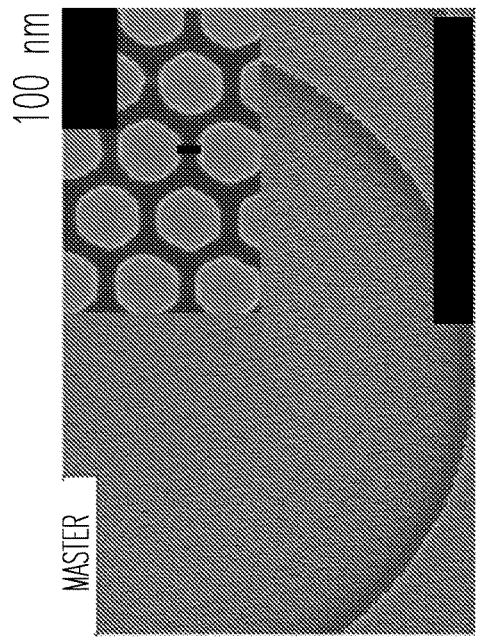
Figure 7D:
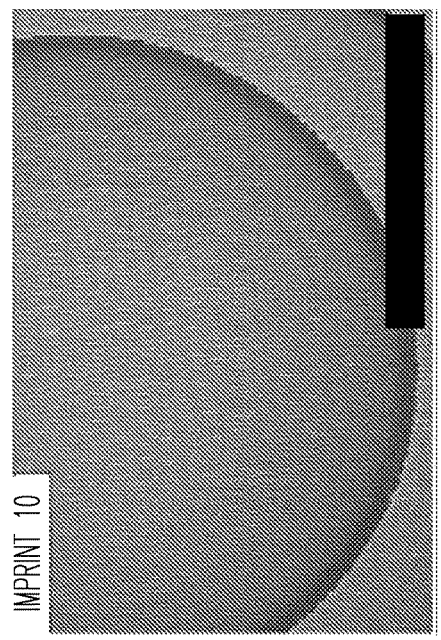
Figure 8:
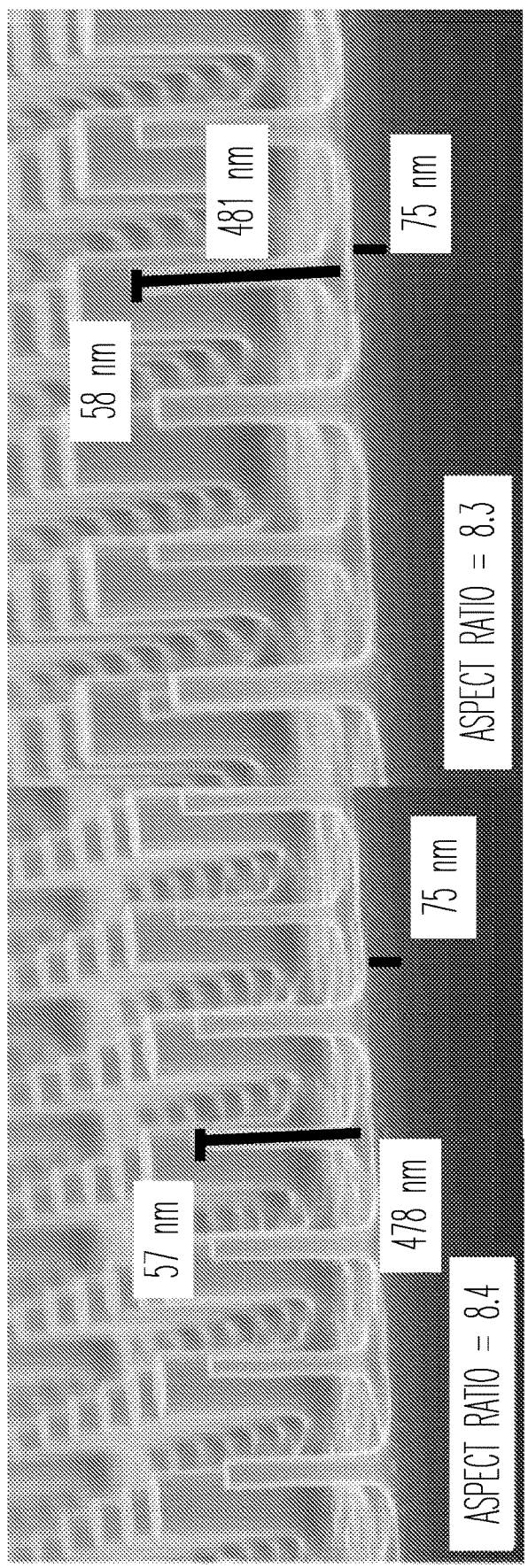
FIG. 8 shows a fabricated structure including a distribution of nanoposts.
Figure 9A:
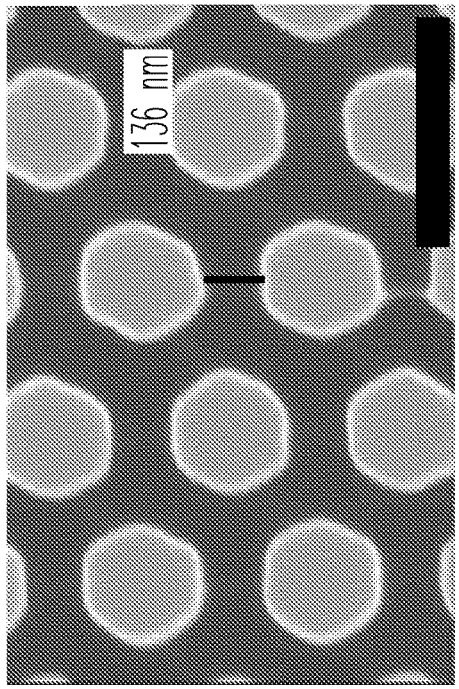
FIGS. 9A-9D shows a series of fabricated structure including nanoposts with a hexagonal cross-sectional profile.
Figure 9B:
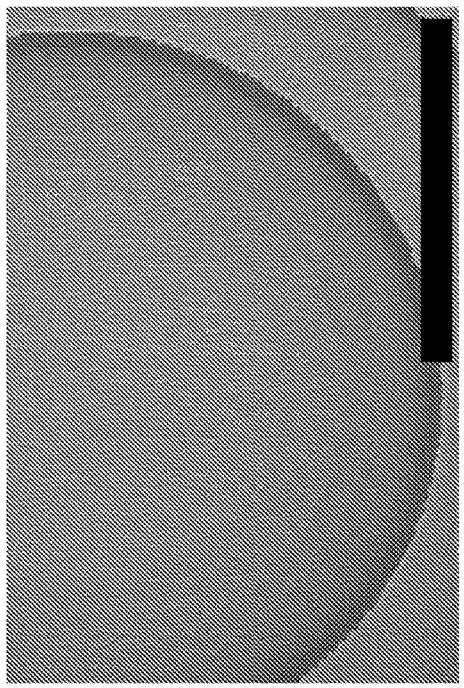
Figure 9C:
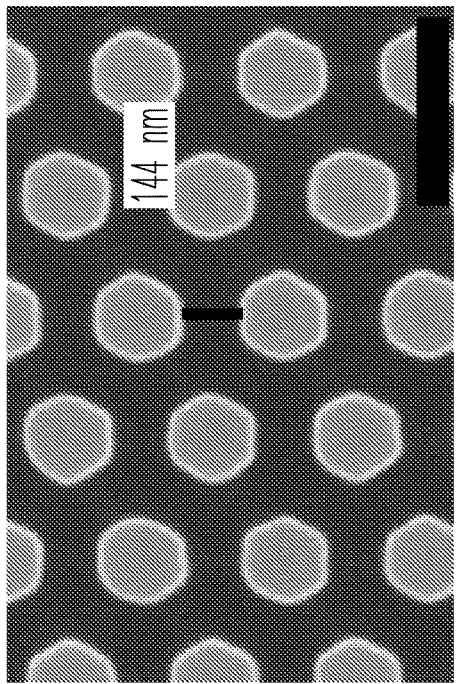
Figure 9D:
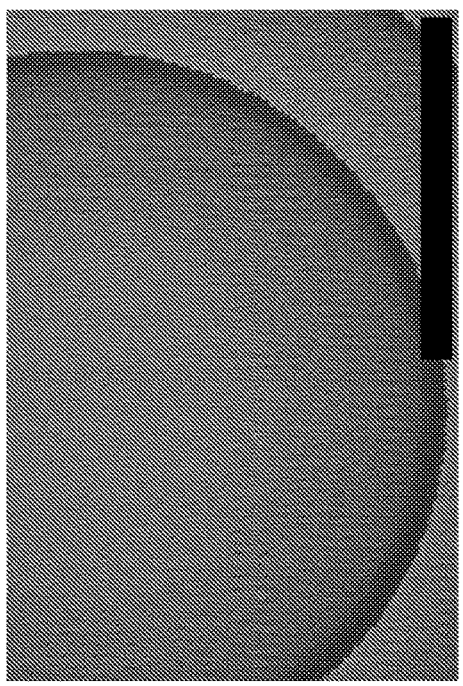

The achievable aspect ratio of these imprint materials, was demonstrated by manufacturing a metasurface pattern. The metasurface was generated using Pixelligent TiO$_2$ 9.0%, PGMEA 9.0%, Ethyl Lactate 80.3%, 3MPS 1.6% and Capstone FS66 0.1% by weight. This mixture was cured in mold using 35V, 5 ms on 15 ms off, 3000 repetitions as shown in FIG. 6. The process was repeated manually with the same stamp 15 times to demonstrate reliability and feature degradation at high number of imprints. Comparison of imprints 1, 5, and 10 to the original master can be seen in FIGS. 7A-7D. In order to determine the feature height retention, cross sectional SEM images were taken of the imprints and measured using an image analysis software to determine aspect ratios greater than 8 as seen in FIG. 8. The approximate dimensions of the printed posts range from 50 to 250 nm in width and 450 to 550 nm in height dependent on positioning within the pattern and the design of the metasurface. The pulsed UV rapid in-mold curing process enhanced the mechanical properties of the imprinted features by sintering of the inorganic moieties, which mitigates damage to high aspect ratio features (greater than 8 in this example) during mold release.

For applications where required refractive index values exceed the as imprinted material, post imprint treatments can provide a boost to refractive index by calcination and burn out of carbon and successive ALD depositions to backfill the structure. By using a pulsed gas phase precursor system as a controlled temperature and pressure, the ALD can be used to backfill the structure without increasing the feature size as seen in FIGS. 9A-9D. The ALD process required no solution processing or contact and left the initially imprinted structure intact.

The examples show effective cure in radical (acrylate), and ionic (epoxy) chemistries, but additional chemistries could be used to crosslink these types of systems. These may include a broader range of radical chemistries including dithiol and thiolene, as well as more controlled radical polymerizations such as RAFT (reversible addition fragmentation chain transfer polymerization), ATRP (Atom transfer radical polymerization), NMP (Nitroxide mediated polymerization) and living polymerization. Ionic binding chemistries include basic and acidic triggers that solidify the nanoparticle film using a photosensitive component that degrades and forms a basic or acidic product. These in situ reactions generate pH changes that can induce further reactivity of the binder an example being sol-gel precursors react more quickly under acidic and basic conditions. Additionally, epoxies are known as cationically polymerized entities that react upon the addition of acid. However, a broader range of polymers and monomers could be cured utilizing similar cationic chemistry. Various monomers containing an electron rich vinyl are known to polymerize in the presence of acid such as methoxyethylene, 4-methoxystyrene and styrene. PAG and PBG can be used for condensation reactions such as Fischer transesterification, leaving potential for an ester or polyester containing binder. PAG and PBG can also be used in deprotection chemistries where a binder can be stabilized by a base or acid sensitive protecting group, preventing reactivity until deprotected from a PAG or PBG. Organic and inorganic photosensitive oxidizing agents can be used to cure through mediating oxide bridge formation between the nanoparticles.

An example of requiring a low thermal budget cure is during the process of a two-sided imprint where the features are aligned to a 1 μm to 10 nm accuracy. Due to an inherent limitation of thermal expansion mismatch between the substrate and the imprint material, the thermal drift at this scale requires a low thermal change, otherwise the thermal expansion alone can prevent alignment by expanding the plane of the imprint material in an uncontrolled manner. Therefore, a low thermal imprint cure is used for alignment processes where, for example, a wafer, composed of glass, polymer, metal or metal oxide can be imprinted on one side directly. The one-sided wafer imprint can then be inverted such that the unpatterned side can be imprinted. Before imprinting the second side, Moiré alignment can be conducted where an optical stimulus can direct sub 100 nm alignment by matching line or grid patterns on the substrate and stamp that negatively or positively interact with each other in order to direct optimal alignment. When the interactions are all positive or negative, this ensures proper alignment across an entire substrate if done with multiple fiduciary markers. After alignment, the imprint can be conducted, and UV cured at a low temperature change and gradient allowing for the resulting structures to be in line with the alignment technique. However, if the temperature change of the imprint and substrate assembly is large during the curing process, the alignment may be successful, but the thermal drift prevents any useful alignment in the final device.

Therefore, for two-sided alignment processes, a thermal cure will prevent proper alignment and devise functionality. A UV cure with a low thermal change will allow Moiré alignment to be successful at smaller scales and facilitate the fabrication of a device where individual nanostructures are aligned to sub 100 nm. Additionally, a low thermal budget UV cure with high refractive index materials is the ideal case for optics as the benefits are compounded from both a higher refractive index and better alignment. These attributes of this system improve device performance drastically and make the technique applicable to a wider range of devices. Alignment techniques such as the example described here can also be utilized in multiple layer imprinting, such as a woodpile or other imprint stacks where multiple imprints can be conducted to afford a three-dimensional structure from individual imprints. This process requires the same low thermal budget UV cure and alignment but does not require 2-sided imprinting. These stacked imprints are more susceptible to thermal drift as each layer will have its own thermal expansion mismatch and will therefore have thermal drift in all dimensions instead of purely the planar direction.

To form a two-sided structure, a 300 mm wafer cassette can be loaded with 25 high refractive index glass substrates ranging from 1.6 to 2.0 depending on the application and mounted into a modified AutoSCIL 150 high volume manufacturing tool. The tool will require modification by incorporation of a high intensity pulsed UV system as well as a camera system for Moiré alignment. The substrates will be cleaned prior to loading by solvent, drying and oxidation by UV/ozone or oxygen plasma. After loading the cassette, the tool will remove a substrate and transfer it to a substrate alignment stage where to tool analyzes the wafer and places the notch and bar code in a consistent position, this is termed pre-alignment and takes 16.5 seconds. The tool then transfers the positioned substrate to the spin coating station within 18 seconds. Parameters for spin coating can be tailored depending on the ink composition and feature dimensions. For the highest refractive index ink with 240 nm feature height and etch depth, 4000 rpm with a 1500 ramp rate for 4 seconds affords a wet film that can sustain the transfer time to the imprint section of the tool before drying or curing. The transfer time to the imprint station is 17 seconds and affixing to the chuck within the imprint station is 3 seconds. Then the first imprint can be done, where stamp contact begins on one edge of the substrate and is pneumatically actuated using linear channels to press the stamp onto the substrate until the opposite edge makes contact. The duration of the stamp placement is variable based on the ink viscosity as it is limited by the capillary flow into the stamp features. For a low viscosity fluid, a stamp placement could take as little as 3 seconds and for a high viscous material, the stamp placement could take up to 30 seconds. The nanoparticle inks have a sharp viscosity change when drying and the process is adjusted such that during the stamp placement, the viscosity remains low and stamp placement can be done quickly (less than 10 s). After stamp placement, the UV module will be mechanically translated to be positioned above the stamp, which requires 14 seconds before UV treatment can begin. Afterwards, the UV exposure is conducted, which for the highest refractive index ink requires 40-45 seconds of exposure and results in heat transfer to the tool of less than 0.5° C. using 35V overdriven 365 nm LEDs with a 5 ms on 15 ms off 2000 repetitions pulse duration. The UV module is then translated away from the imprinting station such that stamp release can be done, this requires another 14 seconds. Stamp release can be variable based on the resulting adhesion and strength of the imprint materials within similar ranges of stamp placement 3-30 seconds. For high refractive index materials, a slower release time of 30 seconds will provide less damage to the features. After stamp release, the tool will remove the first imprint and transfer it to Cassette 2 in 20 seconds, which for a 25-substrate cassette and after 30-45 minutes of processing time will be fully loaded with 1 sided imprints. This cassette can then be removed, inverted and mounted where Cassette 1 was such that the imprints face down and can be imprinted on the back side for a second, aligned imprint.

The process for the second imprint will be similar, with an added alignment step. The tool will take 16.5 seconds to transfer to the prealigner, 18 seconds from the prealigner to the spin coater, 4 second spin coating, and 20 second total transfer time to the imprint station. After transfer to the imprint station, the tool will utilize Moiré alignment to ensure the stamp and previous imprint are aligned to the desired resolution of sub 100 nm. Therefore, an alignment camera will be translated to the imprint station and optically aligned, requiring 9 seconds of added process time. The stamp placement can be done in less than 30 seconds as described before and is followed by the UV module translation into the imprinting station for 17 seconds. The UV treatment will be conducted similar to the first imprint for 40 seconds, maintaining less than half a degree external heating. The UV module and cameras are then moved away, taking 17 seconds, followed by the stamp release for 30 seconds. The two-sided imprint can then be transferred from the imprinting station to Cassette 3, which takes 20 seconds.

The terms and expressions that have been employed are used as terms of description and not of limitation, and there is no intention in the use of such terms and expressions of excluding any equivalents of the features shown and described or portions thereof, but it is recognized that various modifications are possible within the scope of the examples of the present disclosure. Thus, it should be understood that although the present disclosure has been specifically disclosed by specific examples and optional features, modification and variation of the concepts herein disclosed may be resorted to by those of ordinary skill in the art, and that such modifications and variations are considered to be within the scope of examples of the present disclosure.

ADDITIONAL EXAMPLES

The following exemplary examples are provided, the numbering of which is not to be construed as designating levels of importance:

Example 1 provides a method of manufacturing a mechanically stabilized material comprising a nanostructure, the method comprising:
  providing a curable material disposed on a substrate, the curable material comprising inorganic nanoparticles; and
  exposing the curable material and the substrate to pulsed electromagnetic radiation to form the mechanically stabilized material.

Example 2 provides the method of Example 1, wherein the inorganic nanoparticles are in a range of from about 0.01 wt % to about 100 wt % of the curable material.

Example 3 provides the method of any one of Examples 1 or 2, wherein the inorganic nanoparticles are in a range of from about 1 wt % to about 80 wt % of the curable material.

Example 4 provides the method of any one of Examples 1-3, wherein the curable material comprises an ink, a resin mixture, or a combination thereof.

Example 5 provides the method of Example 4, wherein the resin mixture comprises acrylate resins, epoxy resins, or a combination thereof.

Example 6 provides the method of any one of Examples 1-5, wherein an average major dimension of the inorganic nanoparticles is in a range of from about 0.1 nm to about 100 nm.

Example 7 provides the method of any one of Examples 1-6, wherein an average major dimension of the inorganic nanoparticles is in a range of from about 1 nm to about 70 nm.

Example 8 provides the method of any one of Examples 1-7, wherein the inorganic nanoparticles comprise metal oxide nanoparticles.

Example 9 provides the method of Example 8, wherein the metal oxide nanoparticles comprise $ZrO_2$, $TiO_2$, $LiMn_2O_4$, $Li_4Ti_5O_{12}$, or combinations thereof.

Example 10 provides the method of Example 9, wherein the metal oxide nanoparticles comprising $TiO_2$ are surface modified with a silicone, a silane, a silsequioxane, a polyoligolsilsesquioxane, a compound comprising a vinyl moiety, a methacrylate, a compound comprising a benzocyclobutane moiety, or combinations thereof.

Example 11 provides the method of Example 10, wherein during exposing a plurality of the metal oxide nanoparticles comprising $TiO_2$ are joined by the silicone, the silane, the silsequioxane, the polyoligolsilsesquioxane, the compound comprising a vinyl moiety, the methacrylate, the compound comprising a benzocyclobutane moiety, or combinations thereof.

Example 12 provides the method of any one of Examples 10 or 11, wherein the silicone, the silane, the silsequioxane, the polyoligolsilsesquioxane, the compound comprising a vinyl moiety, the methacrylate, the compound comprising a benzocyclobutane moiety, or combinations thereof comprise a protecting group bonded thereto.

Example 13 provides the method of any one of Examples 1-12, wherein at least some of the inorganic nanoparticles comprise a surfactant functionalized to a surface of the at least some inorganic nanoparticles.

Example 14 provides the method of any one of Examples 1-13, wherein the curable material further comprises at least one additive chosen from a polymer, a resin mixture, a binder, a sol-gel precursor, or combinations thereof.

Example 15 provides the method of Example 14, wherein the binder comprises a methacrylate.

Example 16 provides the method of any one of Examples 14 or 15, wherein the binder comprises 3 trimethoxysilyl propyl methacrylate.

Example 17 provides the method of any one of Examples 1-16, wherein a pH of the curable material is in a range of from about 1 to about 7.

Example 18 provides the method of any one of Examples 1-17, wherein a pH of the curable material is in a range of from about 4 to about 5.

Example 19 provides the method of any one of Examples 1-18, wherein the substrate increases in temperature by less than 10° C. during the exposing.

Example 20 provides the method of any one of Examples 1-19, wherein the substrate increases in temperature by less than 1° C. during the exposing.

Example 21 provides the method of any one of Examples 1-20, wherein the substrate is substantially free of heating during the exposing.

Example 22 provides the method of any one of Examples 19-21, wherein the substrate comprises a biological, glass, polymeric, metal, metal oxide, semiconductor prepatterned, or surface treated material.

Example 23 provides the method of Example 22, wherein the glass is substantially transparent to ultraviolet electromagnetic radiation.

Example 24 provides the method of any one of Examples 1-23, wherein the curable material comprises a nanostructure shape on the substrate chosen from serpentine lines, parallel zig-zag lines, parallel lines, grid structures, concentric circles, regular polygons, or combinations thereof.

Example 25 provides the method of any one of Examples 1-24, further comprising stamping the curable material on the substrate with a mold.

Example 26 provides the method of Example 25, wherein the mold comprises a patterned nanostructure comprising serpentine lines, parallel zig-zag lines, parallel lines, grid structures, concentric circles, regular polygons, or combinations thereof.

Example 27 provides the method of any one of Examples 25 or 26, wherein the mold comprises a material that is substantially transparent to the electromagnetic radiation.

Example 28 provides the method of any one of Examples 25-27, wherein the mold comprises polydimethylsiloxane.

Example 29 provides the method of any one of Examples 25-28, wherein the mold comprises a release agent.

Example 30 provides the method of Example 29, wherein the release agent comprises a PEG-b-PFPE block copolymer.

Example 31 provides the method of any one of Examples 25-30, wherein the mold increases in temperature by less than 10° C. during the exposing.

Example 32 provides the method of any one of Examples 1-31, wherein the mold increases in temperature by less than 1° C. during the exposing.

Example 33 provides the method of any one of Examples 25-32, wherein the mold is substantially free of heating during exposing of the pulsed electromagnetic radiation to the mold.

Example 34 provides the method of any one of Examples 25-33, further comprising removing the mold from contact with the mechanically stabilized material without damaging the mechanically stabilized material.

Example 35 provides the method of any one of Examples 1-34, wherein the curable material comprises one or more layers.

Example 36 provides the method of any one of any one of Examples 1-35, wherein the exposing comprises delivering electromagnetic radiation over a preselected surface area of the curable material.

Example 37 provides the method of any one of Examples 1-36, wherein the pulsed electromagnetic radiation is from a light emitting diode lamp.

Example 38 provides the method of any one of Examples 1-37, wherein the pulsed electromagnetic radiation has a wavelength of about 250 nm to about 400 nm.

Example 39 provides the method of any one of Examples 1-38, wherein the exposing comprises delivering pulsed electromagnetic radiation with an energy dose of about 10 $J/cm^2$ to about 500 $J/cm^2$.

Example 40 provides the method of any one of Examples 1-39, wherein the exposing comprises a pulse sequence comprising pulsing the electromagnetic radiation for about 5 ms to about 60 ms and turning off the pulsed electromagnetic radiation for about 70 ms to about 150 ms.

Example 41 provides the method of Example 40, wherein the pulse sequence is repeated about 50 to about 500 times.

Example 42 provides the method of any one of Examples 1-41, wherein the curable material is heated to a temperature of about 20° C. to about 650° C. by the pulsed electromagnetic radiation.

Example 43 provides the method of any one of Examples 1-42, wherein the curable material is heated to a temperature of about 100° C. to about 400° C. by the pulsed electromagnetic radiation.

Example 44 provides the method of any one of Examples 1-43, wherein the electromagnetic radiation is ultraviolet electromagnetic radiation.

Example 45 provides the method of any one of Examples 1-44, wherein the curable material and mechanically stabilized material experience substantially no thermal drift during or after the exposing.

Example 46 provides a method of making an electrode, a battery, or electronic device comprising the method of any one of Examples 1-45.

Example 47 provides the method of any one of Examples 1-46, further comprising removing the mechanically stabilized material from the substrate, the mold, or both and wherein the mechanically stabilized material is substantially free of defects following removal.

Example 48 provides a method of manufacturing a mechanically stabilized material comprising a nanostructure, the method comprising:
providing a curable material on a substrate, the curable material comprising $TiO_2$ nanoparticles; and
exposing the curable material and the substrate to pulsed electromagnetic radiation with a wavelength of about 340 nm to about 380 nm and an energy dose of about 240 $J/cm^2$ to about 320 $J/cm^2$ to form the mechanically stabilized material.

Example 49 provides a method of manufacturing a mechanically stabilized material comprising a nanostructure, the method comprising:
providing an inorganic nanoparticle ink on a substrate;
stamping the inorganic nanoparticle ink on the substrate with a mold to form a curable material on the substrate, wherein the curable material comprises a shape on the substrate chosen from serpentine lines, parallel zig-zag lines, parallel lines, grid structures, concentric circles, regular polygons, or combinations thereof;
exposing the mold, the curable material, and the substrate to pulsed electromagnetic radiation with a wavelength of about 340 nm to about 380 nm and an energy dose of about 20 $J/cm^2$ to about 320 $J/cm^2$ to form the mechanically stabilized material, wherein the mold and the substrate are not substantially heated by the pulsed electromagnetic radiation; and
removing the mold without substantially damaging the mechanically stabilized material.

Example 50 provides a mechanically stabilized material formed according to the method of any one of Examples 1-49.

Example 51 provides the method of any one of Examples 25-50, wherein the substrate, mold, or both increases in temperature by less than 0.5° C. during the exposing.

Example 52 provides the method of any one of Examples 25-51, wherein the substrate, mold, or both increases in temperature by less than 0.1° C. during the exposing.

Example 53 provides the method of any one of Examples 1-52, wherein the mechanically stabilized material comprises one or more features that are aligned with the substrate with a tolerance less than about 10 nm.

Example 54 provides the method of any one of Examples 1-53, wherein the mechanically stabilized material comprises one or more features that are aligned with the substrate with a tolerance less than about 3 nm.

Example 55 provides the method of Example 54, wherein the one or more features are aligned substantially according to a Moiré pattern.

Example 56 provides the method of any one of Examples 1-55, wherein the electromagnetic radiation is delivered simultaneously with stamping.

Example 57 provides the method of any one of Examples 1-56, wherein the substrate is substantially transparent to a preselected wavelength of electromagnetic radiation.

Example 58 provides the method of any one of Examples 1-57, wherein substantially all organic material is removed from the curable material during exposure.

Example 59 provides the method of any one of Examples 14-58, wherein the binder is at least partially oxidized during exposure.

Example 60 provides the method of any one of Examples 1-59, wherein the curable material is photocatalytic.

Example 61 provides the mechanically stabilized material of any one of claims 1-60, wherein a plurality of features on a first side, second side, or both of the substrate are aligned to within less than 50 nm.

Example 62 provides the mechanically stabilized material of any one of claims 1-61, wherein a plurality of features on a first side, second side, or both of the substrate are aligned to within less than 5 nm.

Example 63 provides the mechanically stabilized material of any one of claim 61 or 62, wherein the plurality of features are aligned simultaneously with exposing the curable material and the substrate to the pulsed electromagnetic radiation.

Example 63 provides a lens comprising the mechanically stabilized material of any one of claims 1-62.

Example 64 provides a wave guide comprising the mechanically stabilized material of any one of claims 1-63.

Example 65 provides a method of manufacturing a mechanically stabilized material comprising a nanostructure, the method comprising:
providing a curable material disposed on a substrate, the curable material comprising inorganic nanoparticles;
stamping the curable material on the substrate with a mold to form a plurality of features in the curable material, wherein the features are aligned to within less than 50 nm; and
simultaneously exposing the curable material, substrate, and mold to pulsed electromagnetic radiation to form the mechanically stabilized material, wherein the mold increases in temperature by less than 10° C. during the exposing.

Example 66 provides the method of Example 65, wherein the curable material is disposed on a first side of the substrate and the method further comprises: disposing the curable material on a second side of the substrate; and stamping the curable material disposed on the second side of the substrate.

Example 67 provides the method of any one of Examples 65 or 66, wherein the inorganic nanoparticles are in a range of from about 0.01 wt % to about 100 wt % of the curable material.

Example 68 provides the method of any one of Examples 65-67, wherein the inorganic nanoparticles are in a range of from about 1 wt % to about 50 wt % of the curable material.

Example 69 provides the method of any one of Examples 65-68, wherein the curable material comprises an ink, a resin mixture, or a combination thereof.

Example 70 provides the method of Example 69, wherein the resin mixture comprises acrylate resins, epoxy resins, or a combination thereof.

Example 71 provides the method of any one of Examples 65-70, wherein an average major dimension of the inorganic nanoparticles is in a range of from about 0.1 nm to about 100 nm.

Example 72 provides the method of any one of Examples 65-71, wherein an average major dimension of the inorganic nanoparticles is in a range of from about 1 nm to about 70 nm.

Example 73 provides the method of any one of Examples 65-72, wherein the inorganic nanoparticles comprise metal oxide nanoparticles.

Example 74 provides the method of Example 73, wherein the metal oxide nanoparticles comprise $TiO_2$, $LiMn_2O_4$, $Li_4Ti_5O_{12}$, or combinations thereof.

Example 75 provides the method of Example 74, wherein the metal oxide nanoparticles comprising $TiO_2$ are surface modified with a silicone, a silane, a silsequioxane, a polyoligolsilsesquioxane, a compound comprising a vinyl moiety, a methacrylate, a compound comprising a benzocyclobutane moiety, or combinations thereof.

Example 76 provides the method of Example 75, wherein during exposing a plurality of the metal oxide nanoparticles comprising $TiO_2$ are joined by the silicone, the silane, the silsequioxane, the polyoligolsilsesquioxane, the compound comprising a vinyl moiety, the methacrylate, the compound comprising a benzocyclobutane moiety, or combinations thereof.

Example 77 provides the method of any one of Examples 75 or 76, wherein the silicone, the silane, the silsequioxane, the polyoligolsilsesquioxane, the compound comprising a vinyl moiety, the methacrylate, the compound comprising a benzocyclobutane moiety, or combinations thereof comprise a protecting group bonded thereto.

Example 78 provides the method of any one of Examples 65-77, wherein at least some of the inorganic nanoparticles comprise a surfactant functionalized to a surface of the at least some inorganic nanoparticles.

Example 79 provides the method of any one of Examples 65-78, wherein the curable material further comprises at least one additive chosen from a polymer, a resin mixture, a binder, a sol-gel precursor, or combinations thereof.

Example 80 provides the method of Example 79, wherein the binder comprises a methacrylate.

Example 81 provides the method of any one of Examples 79 or 80, wherein the binder comprises 3 trimethoxysilyl propyl methacrylate.

Example 82 provides the method of any one of Examples 65-81, wherein a pH of the curable material is in a range of from about 1 to about 7.

Example 83 provides the method of any one of Examples 65-82, wherein a pH of the curable material is in a range of from about 4 to about 5.

Example 84 provides the method of any one of Examples 65-83, wherein the substrate increases in temperature by less than 10° C. during the exposing.

Example 85 provides the method of any one of Examples 65-84, wherein the substrate increases in temperature by less than 1° C. during the exposing.

Example 86 provides the method of any one of Examples 65-85, wherein the substrate is substantially free of heating during the exposing.

Example 87 provides the method of any one of Examples 65-86, wherein the substrate comprises a biological material, glass, or a mixture thereof.

Example 88 provides the method of Example 87, wherein the glass is substantially transparent to ultraviolet electromagnetic radiation.

Example 89 provides the method of any one of Examples 65-88, wherein the curable material comprises a nanostructure shape on the substrate chosen from serpentine lines, parallel zig-zag lines, parallel lines, grid structures, concentric circles, regular polygons, or combinations thereof.

Example 90 provides the method of any one of Examples 65-89, further comprising stamping the curable material on the substrate with a mold.

Example 91 provides the method of Example 90, wherein the mold comprises a patterned nanostructure comprising serpentine lines, parallel zig-zag lines, parallel lines, grid structures, concentric circles, regular polygons, or combinations thereof.

Example 92 provides the method of any one of Examples 79 or 91, wherein the mold comprises a material that is substantially transparent to the electromagnetic radiation.

Example 93 provides the method of any one of Examples 79-92, wherein the mold comprises polydimethylsiloxane.

Example 94 provides the method of any one of Examples 79-93, wherein the mold comprises a release agent.

Example 95 provides the method of Example 94, wherein the release agent comprises a PEG-b-PFPE block copolymer.

Example 96 provides the method of any one of Examples 65-95, wherein the mold increases in temperature by less than 1° C. during the exposing.

Example 97 provides the method of any one of Examples 96-96, wherein the mold is substantially free of heating during exposing of the pulsed electromagnetic radiation to the mold.

Example 98 provides the method of any one of Examples 96-97, further comprising removing the mold from contact with the mechanically stabilized material without damaging the mechanically stabilized material.

Example 99 provides the method of any one of Examples 65-98, wherein the curable material comprises one or more layers.

Example 100 provides the method of any one of any one of Examples 65-99, wherein the exposing comprises delivering electromagnetic radiation over a preselected surface area of the curable material.

Example 101 provides the method of any one of Examples 65-100, wherein the pulsed electromagnetic radiation is from a light emitting diode lamp Example 102 provides the method of any one of Examples 65-101, wherein the pulsed electromagnetic radiation has a wavelength of about 250 nm to about 400 nm.

Example 103 provides the method of any one of Examples 65-102, wherein the exposing comprises delivering pulsed electromagnetic radiation with an energy dose of about 20 $J/cm^2$ to about 500 $J/cm^2$.

Example 104 provides the method of any one of Examples 65-103, wherein the exposing comprises a pulse sequence comprising pulsing the electromagnetic radiation for about 5 ms to about 60 ms and turning off the pulsed electromagnetic radiation for about 70 ms to about 150 ms.

Example 105 provides the method of Example 104, wherein the pulse sequence is repeated about 50 to about 500 times.

Example 106 provides the method of any one of Examples 65-105, wherein the curable material is heated to a temperature of about 0° C. to about 650° C. by the pulsed electromagnetic radiation.

Example 107 provides the method of any one of Examples 65-106, wherein the curable material is heated to a temperature of about 100° C. to about 400° C. by the pulsed electromagnetic radiation.

Example 108 provides the method of any one of Examples 65-107, wherein the electromagnetic radiation is ultraviolet electromagnetic radiation.

Example 109 provides the method of any one of Examples 65-108, wherein the curable material and mechanically stabilized material experience substantially no thermal drift during or after the exposing.

Example 110 provides the method of any one of Examples 65-109, further comprising removing the mechanically stabilized material from the substrate, the mold, or both and wherein the mechanically stabilized material is substantially free of defects following removal.

Example 111 provides a mechanically stabilized material formed according to the method of any one of Examples 1-110.

Example 112 provides a method of making an electrode, a battery, or electronic device comprising the method of any one of Examples 1-110.

Example 113 provides an optical device formed according to the method of any one of Examples 1-110.

Example 114 provides a diffractive optical element formed according to the method of any one of Examples 1-110

Example 115 provides a single-sided optical blaze grating formed according to the method of any one of Examples 1-64

Example 116 provides a double-sided optical blaze grating formed according to the method of any one of Example Examples 65-110.

Example 117 provides a flat lens formed according to the method of any one of Examples 1-64.

Example 118 provides a meta-lens formed according to the method of any one of Examples 1-64.

What is claimed is:

1. A method of manufacturing a mechanically stabilized material comprising a nanostructure, the method comprising:
stamping a curable material comprising inorganic nanoparticles disposed on a first side of a substrate with a mold comprising a patterned nanostructure to transfer an imprint of the patterned nanostructure to the curable material disposed on the first side of the substrate;
curing the curable material disposed on the first side of the substrate to cure the curable material disposed on the first side of the substrate;
aligning the mold facing a second side of the substrate opposite the first side, the second side of the substrate comprising the curable material disposed thereon, with the imprint of the patterned nanostructure transferred to the curable material disposed on the first side of the substrate; and
performing the stamping and curing on the curable material disposed on the second side of the substrate to transfer an imprint of the patterned nanostructure to the curable material disposed on the second side of the substrate and to cure the curable material disposed on the second side of the substrate, to form the mechanically stabilized material;
wherein the imprint of the patterned nanostructure on the curable material disposed on the first side of the substrate is aligned to the imprint of the patterned nanostructure on the curable material disposed on the second side of the substrate within less than 1 micron, and wherein one or both of the curing the curable material disposed on the first side of the substrate and the curing the curable material disposed on the second side of the substrate comprises exposing the substrate and the curable material to pulsed electromagnetic radiation having a wavelength of about 250 nm to about 400 nm to increase a temperature of the exposed curable material by $>0°$ C. and $<5°$ C. to cure the curable material.

2. The method of claim 1, wherein the curable material comprises an ink, a resin mixture, or a combination thereof.

3. The method of claim 1, wherein the curable material further comprises at least one additive chosen from a polymer, a resin mixture, a binder, and a sol-gel precursor.

4. The method of claim 1, wherein the patterned nanostructure is chosen from serpentine lines, parallel zig-zag lines, parallel lines, grid structures, concentric circles, regular polygons, cylinders, posts, lenses, flat lenses, metasurfaces, and combinations thereof.

5. The method of claim 1, wherein the mold is substantially transparent to electromagnetic radiation and the patterned nanostructure comprises serpentine lines, parallel zig-zag lines, parallel lines, grid structures, concentric circles, regular polygons, cylinders, posts, lenses, flat lenses, metasurfaces, or combinations thereof.

6. The method of claim 1, wherein the exposing comprises delivering electromagnetic radiation over a preselected surface area of the curable material.

7. The method of claim 1, wherein the pulsed electromagnetic radiation is from a light emitting diode.

8. The method of claim 1, wherein the exposing comprises a pulse sequence comprising pulsing the electromagnetic radiation for about 5 ms to about 60 ms and turning off the pulsed electromagnetic radiation for about 70 ms to about 150 ms.

9. The method of claim 1, wherein the curable material and mechanically stabilized material experience substantially no thermal drift during or after the exposing.

10. The method of claim 1, wherein the nanostructure comprises one or more printed posts independently having aspect ratios (length to width) greater than about 8.

11. The method of claim 1, further comprising performing at least one cycle of atomic layer deposition to backfill the mechanically stabilized material.

12. The method of claim 1, wherein providing the curable material disposed on the substrate comprises providing an inorganic nanoparticle ink on the substrate and stamping the inorganic nanoparticle ink on the substrate with the mold to form a curable material on the substrate, wherein the curable material comprises a shape on the substrate chosen from serpentine lines, parallel zig-zag lines, parallel lines, grid structures, concentric circles, regular polygons, cylinders, posts, lenses, flat lenses, metasurfaces, and combinations thereof, wherein exposing the curable material and the substrate to the pulsed electromagnetic radiation comprises exposing the mold, the curable material, and the substrate to the pulsed electromagnetic radiation, wherein the mold and the substrate are not substantially heated by the pulsed electromagnetic radiation, wherein the method further comprises:
removing the mold without substantially damaging the mechanically stabilized material.

13. The method of claim 1, wherein the imprint of the patterned structure on the first side and the second side of the substrate are aligned to within less than 100 nm.

14. The method of claim 1, wherein the imprint of the patterned structure on the first side and the second side of the substrate are aligned prior to or simultaneously with exposing the curable material and the substrate to the pulsed electromagnetic radiation.

15. The method of claim 1, wherein the mechanically stabilized material formed by the method comprises at least one of an optical device, diffractive optical element, single-sided optical blaze grating, double-sided optical blaze grating, flat lens, or meta lens.

16. The method of claim 1, wherein the pulsed electromagnetic radiation has an energy of an energy in a range of 20 W/cm$^2$ to 500 W/cm$^2$.

17. The method of claim 1, wherein the exposing the curable material and the substrate to the pulsed electromagnetic radiation increases the temperature of the curable material by $>0°$ C. and $<1°$ C.

18. The method of claim 1, wherein the aligning of the mold facing the second side of the substrate opposite the first side with the imprint of the patterned nanostructure transferred to the curable material disposed on the first side of the substrate is performed using Moiré alignment.

19. A method of manufacturing a mechanically stabilized material comprising a nanostructure, the method comprising:
   aligning a patterned nanostructure of a mold facing a first side of a substrate, the first side of the substrate comprising a curable material comprising inorganic nanoparticles disposed thereon, with an imprint of the patterned nanostructure on a second side of the substrate;
   stamping the curable material disposed on the first side of the substrate with the mold to transfer an imprint of the patterned nanostructure to the curable material disposed on the first side of the substrate; and
   exposing the curable material disposed on the first side of the substrate to pulsed electromagnetic radiation having a wavelength of about 250 nm to about 400 nm to increase a temperature of the exposed curable material by $>0°$ C. and $<5°$ C. to cure the curable material and to form the mechanically stabilized material;
   wherein the imprint of the patterned nanostructure on the curable material disposed on the first side of the substrate is aligned to the imprint of the patterned nanostructure on the second side of the substrate within less than 1 micron.

20. The method of claim 19, wherein the aligning of the patterned nanostructure of the mold facing the first side of the substrate with the imprint of the patterned nanostructure on the second side of the substrate is performed using Moiré alignment, and wherein the imprint of the patterned nanostructure on the curable material disposed on the first side of the substrate is aligned to the imprint of the patterned nanostructure on the second side of the substrate within less than 100 nm.

* * * * *